(12) United States Patent
Kedem et al.

(10) Patent No.: US 10,629,833 B2
(45) Date of Patent: Apr. 21, 2020

(54) FLASHING RATCHETS

(71) Applicant: Northwestern University, Evanston, IL (US)

(72) Inventors: Ofer Kedem, Evanston, IL (US); Bryan Lau, Evanston, IL (US); Emily A. Weiss, Evanston, IL (US)

(73) Assignee: Northwestern University, Evanston, IL (US)

( * ) Notice: Subject to any disclaimer, the term of this patent is extended or adjusted under 35 U.S.C. 154(b) by 228 days.

(21) Appl. No.: 15/819,911

(22) Filed: Nov. 21, 2017

(65) Prior Publication Data

US 2018/0145271 A1    May 24, 2018

Related U.S. Application Data

(60) Provisional application No. 62/424,816, filed on Nov. 21, 2016.

(51) Int. Cl.

| *H01L 51/42* | (2006.01) |
| *C09D 5/24* | (2006.01) |
| *C08K 3/04* | (2006.01) |
| *H01L 51/05* | (2006.01) |
| *C09D 165/00* | (2006.01) |
| *H01L 51/00* | (2006.01) |
| *C08K 9/04* | (2006.01) |

(52) U.S. Cl.
CPC ............ *H01L 51/428* (2013.01); *C08K 3/045* (2017.05); *C09D 5/24* (2013.01); *H01L 51/055* (2013.01); *H01L 51/0566* (2013.01); *H01L 51/4253* (2013.01); *C08G 2261/1412* (2013.01); *C08G 2261/3223* (2013.01); *C08K 9/04* (2013.01); *C08K 2201/001* (2013.01); *C09D 165/00* (2013.01); *H01L 51/0036* (2013.01); *H01L 51/0047* (2013.01); *Y02E 10/549* (2013.01)

(58) Field of Classification Search
CPC .. H01L 51/428; H01L 51/4253; H01L 51/055
See application file for complete search history.

(56) References Cited

U.S. PATENT DOCUMENTS

| 2006/0289341 A1* | 12/2006 | Muller | ................ B03C 5/005 209/210 |
| 2010/0120087 A1 | 5/2010 | Kibar et al. | |
| 2010/0190198 A1 | 7/2010 | Kibar et al. | |
| 2012/0006027 A1 | 1/2012 | Kibar et al. | |

OTHER PUBLICATIONS

Astumian, Design principles for Brownian molecular machines: how to swim in molasses and walk in a hurricane, Phys Chem Chem Phys, vol. 9(37), pp. 5067-5083, 2007.

(Continued)

*Primary Examiner* — Douglas M Menz
(74) *Attorney, Agent, or Firm* — Casimir Jones SC; David W. Staple

(57) ABSTRACT

Provided herein are flashing ratchets that produce transport based on the oscillating application of regularly-spaced, asymmetric potentials. In particular, devices are provided that transport electrons without the requirement of an overall source-drain bias favoring electron transport.

17 Claims, 31 Drawing Sheets

(56) References Cited

OTHER PUBLICATIONS

Bader et al., A Brownian-ratchet DNA pump with applications to single-nucleotide polymorphism genotyping, Appl Phys A, vol. 75(2), pp. 275-278, 2002.
Bader et al., DNA transport by a micromachined Brownian ratchet device, PNAS, vol. 96(23), pp. 13165-13169, 1999.
Bisquert et al., Band unpinning and photovoltaic model for P3HT:PCBM organic bulk heterojunctions under illumination, Chem Phys Lett, vol. 465(1-3), pp. 57-62, 2008.
Bisquert et al., Interpretation of electron diffusion coefficient in organic and inorganic semiconductors with broad distributions of states, Phys Chem Chem Phys, vol. 10(22), pp. 3175-3194, 2008.
Browne et al., Making molecular machines work, Nat Nanotechnol, vol. 1, pp. 25-35, 2006.
Carter et al., Mechanics of the kinesin step, Nature, vol. 435, pp. 308-312, 2005.
Chakraborty et al., Stochastic ratcheting of two-dimensional colloids: Directed current and dynamical transitions. Phys. Rev. E 91, 050301(R), 2015.
Chaudhuri et al., Pumping single-file colloids: Absence of current reversal, Phys Rev E91, 050103(R), 2015.
Chauwin et al., Current Reversal in Asymmetric Pumping. Europhys Lett. 1995; 32(4):373-378.
Coropceanu et al., Interaction of Charge Carriers with Lattice Vibrations in Organic Molecular Semiconductors: Naphthalene as a Case Study. J Phys Chem. 2009; 113(11):4679-4686.
Costache et al., Experimental Spin Ratchet, Science, vol. 330(6011), 1645-1648, 2010.
Derenyi et al., Cooperative Transport of Brownian Particles, Phys Rev Lett, vol. 75, pp. 374-377, 1995.
Erbas-Cakmak et al., Artificial Molecular Machines, Chem Rev, vol. 115(18), pp. 10081-10206, 2015.
Foertig et al., Charge carrier concentration and temperature dependent recombination in polymer-fullerene solar cells, Appl Phys Lett, vol. 95, 052104, 2009.
Gebhardt et al., Myosin-V is a mechanical ratchet, PNAS, vol. 103(23), pp. 8680-8685, 2006.
Germs et al., Diffusion enhancement in on/off ratchets, Appl Phys Lett, vol. 102, 073104, 2013.
Germs et al., High-efficiency dielectrophoretic ratchet, Phys Rev E 86, 041106, 2012.
Hanggi et al., Artificial Brownian motors: Controlling transport on the nanoscale, Rev Mod Phys, vol. 81, 387, 2009.
Hoffman, How molecular motors extract order from chaos (a key issues review). Rep Prog Phys. 2016; 79(3), 032601.
Jackson et al., The Next Breakthrough for Organic Photovoltaics? J Phys Chem Lett. 2015; 6(1):77-84.
Kabir et al., Computing With Nonequilibrium Ratchets, IEEE Transactions on Nanotechnology, vol. 12(3), pp. 330-339, 2013.
Kaiser, C.J., The Capacitor Handbook. Springer Science & Business Media. 2012; 118.

Kedem et al., How to Drive a Flashing Electron Ratchet to Maximize Current, Nano Lett, vol. 17(9), pp. 5848-5854, 2017.
Kedem et al., Light-responsive organic flashing electron ratchet, PNAS, vol. 114(33), pp. 8698-8703, 2017.
Kedem et al., Mechanisms of Symmetry Breaking in a Multidimensional Flashing Particle Ratchet. ACS Nano. 2017; 11(7):7148-7155.
Laquai et al., Charge carrier transport and photogeneration in P3HT:PCBM photovoltaic blends, Macromol Rapid Commun, vol. 36(11), pp. 1001-1025, 2015.
Lau et al., An introduction to ratchets in chemistry and biology. Mater Horiz. 2017; 4:310-318.
Lau et al., Identification of two mechanisms for current production in a biharmonic flashing electron ratchet. Phys Rev. 2016; E 93, 062128.
Linke et al., Experimental Tunneling Ratchets, Science, vol. 286(5448), pp. 2314-2317, 1999.
Mihknenko et al., Rectifying electrical noise with an ionic-organic ratchet. Adv Mater. 2015; 27(12):2007-2012.
Muller et al., Wave-form sampling using a driven electron ratchet in a two-dimensional electron system, Appl Phys Lett, vol. 87, 042104, 2005.
Nakayama et al., Plasmonic nanoparticle enhanced light absorption in GaAs solar cells, Appl Phys Lett, vol. 93, 121904, 2008.
Reimann, Brownian motors: noisy transport far from equilibrium, Phys Rep, vol. 361(2-4), pp. 57-265, 2002.
Roeling et al., Organic electronic ratchets doing work, Nat Mater, vol. 10, pp. 51-55, 2011.
Rousselet et al., Directional motion of brownian particles induced by a periodic asymmetric potential. Nature. 1994; 370:446-447.
Rozenbaum, High-temperature brownian motors: Deterministic and stochastic fluctuations of a periodic potential. JETP Lett. 2008; 88(5):342-346.
Salger et al., Directed Transport of Atoms in a Hamiltonian Quantum Ratchet, Science, vol. 326(5957), pp. 1241-1243, 2009.
Silva et al., Controlled multiple reversals of a ratchet effect, Nature, vol. 440, pp. 651-654, 2006.
Stock et al., Molecular Architecture of the Rotary Motor in ATP Synthase, Science, vol. 286(5445), pp. 1700-1705, 1999.
Sze, S. M. et al., Physics of semiconductor devices. Wiley-Interscience: Hoboken, NJ. 2007; p. 815.
Tanaka et al., GaAs-Based Nanowire Devices with Multiple Asymmetric Gates for Electrical Brownian Ratchets, Japanese Journal of Applied Physics, vol. 52(6S), pp. 06GE07, 2013.
Tarlie et al., Optimal modulation of a Brownian ratchet and enhanced sensitivity to a weak external force, PNAS, vol. 95(5), 2039-2043, 1998.
Wang et al., Nanotechnology-Enabled Energy Harvesting for Self-Powered Micro-/Nanosystems, Angew Chem Int Ed Engl, vol. 51, pp. 11700-11721, 2012.
Wu et al., Near-Field, On-Chip Optical Brownian Ratchets, Nano Lett, vol. 16(8), pp. 5261-5266, 2016.
Wulf et al., Force-producing ADP state of myosin bound to actin, PNAS, vol. 113, pp. E1844-E1852, 2016.
Yasin et al., P3HT:PCBM blend based photo organic field effect transistor. Microelectronic Engineering. 2014; 130:13-17.

* cited by examiner

A

B

C

D19E

D21A2

D21B2

D21C2

D23C

D24A

D25D2

FLASHING RATCHETS

CROSS-REFERENCE TO RELATED APPLICATIONS

The present invention claims the priority benefit of U.S. Provisional Patent Application No. 62/424,816, filed Nov. 21, 2017, which is incorporated by reference in its entirety.

STATEMENT REGARDING FEDERAL FUNDING

This invention was made with government support under DE-SC0000989 awarded by the U.S. Department of Energy. The government has certain rights in the invention.

FIELD

Provided herein are flashing ratchets that produce transport based on the oscillating application of regularly-spaced, asymmetric potentials. In particular, devices are provided that transport particles (e.g., electrons) or other charged entities without the requirement of an overall source-drain bias favoring electron transport.

BACKGROUND

Biological environments are noisy, chaotic, and highly damped (ref 1; incorporated by reference in its entirety). Transporting particles under those circumstances is a challenge, for which nature developed molecular motors, such as the myosin-actin system responsible for muscle contraction (ref. 2; incorporated by reference in its entirety), the kinesin molecular walker (ref. 3; incorporated by reference in its entirety) and ATP synthase (ref 4; incorporated by reference in its entirety). Such systems utilize asymmetry to obtain directional motion from non-directional chemical energy in the presence of strong damping and thermal noise (refs. 5,6; incorporated by reference in their entireties) through a mechanism called "ratcheting". Ratcheting is a non-equilibrium process that requires broken spatial and temporal symmetries (ref 6; incorporated by reference in its entirety) and an oscillatory driving potential that exerts no net force in the direction of transport, but maintains the system far from thermodynamic equilibrium. For example, in the myosin-actin system, thermal fluctuations of the myosin head on an elastic tether lead to occasional binding of the head to an actin filament, at which point thermal energy is transduced to elastic energy, and the filaments translate relative to one another. A chemical reaction-coupled conformational change in the myosin head upon translation induces release of the head from the actin filament, and renders the translation irreversible. The system thereby uses a chemical trigger to rectify random thermal motion (ref. 7; incorporated by reference in its entirety). The design principles of these biological systems are today being used to develop a variety of molecular machines (ref 8; incorporated by reference in its entirety), and to achieve, experimentally, ratcheting of micron-sized particles (ref 9; incorporated by reference in its entirety), and, in rare cases, cold atoms (ref. 10; incorporated by reference in its entirety), spin (ref 11; incorporated by reference in its entirety) and electrons (refs. 12,13; incorporated by reference in their entireties).

SUMMARY

Provided herein are flashing ratchets that produce transport based on the oscillating application of regularly-spaced, asymmetric potentials. In particular, devices are provided that transport particles (e.g., electrons) or other charged entities without the requirement of an overall source-drain bias favoring electron transport.

In some embodiments, provided herein are devices comprising: (a) a particle transport layer, (b) a dielectric layer, and (c) an electrode layer comprising multiple regularly spaced electrodes; wherein the dielectric layer physically separates the particle transport layer and the repeating asymmetric electrode layer; wherein application of an electric potential to the electrodes induces repeating asymmetric electric field within the particle transport layer; and wherein time-oscillation of the electric potential results in asymmetric-electric-field-induced mono-directional particle transport through the particle transport layer without the requirement of an overall source-drain bias in the direction of transport. In some embodiments, the particle transport layer comprises a bulk heterojunction (BJH) film. In some embodiments, the BJH film comprises a blend of poly(3-hexyl-thiophene-2,5-diyl) (P3HT) and [6,6]-phenyl-$C_{61}$ butyric acid methyl ester (PCBM). In some embodiments, the BJH film comprises a 1:1 P3HT:PCBM blend. In some embodiments, the particle transport layer produces mobile electrons and holes upon dissociation of photoexcited states. In some embodiments, there is no overall source-drain bias across the particle transport layer. In some embodiments, there is an overall source-drain bias across the particle transport layer in the opposing direction of mono-directional particle transport. In some embodiments, the electrode layer comprises an array of four or more linearly-arranged, regularly-spaced finger electrodes with an asymmetric thickness profile along the direction of transport. In some embodiments, the finger electrodes sit upon a thermal silicon oxide layer. In some embodiments, the finger electrodes are 20 nm to 1 μm (e.g., 20 nm, 30 nm, 40 nm, 50 nm, 60 nm, 70 nm, 80 nm, 90 nm, 1000 nm, 120 nm, 140 nm, 160 nm, 180 nm, 200 nm, 250 nm, 300 nm, 350 nm, 400 nm, 450 nm, 500 nm, 600 nm, 700 nm, 800 nm, 900 nm, 1000 nm, or ranges therebetween) in width. In some embodiments, the finger electrodes are separated by 20 nm to 1 μm (e.g., 20 nm, 30 nm, 40 nm, 50 nm, 60 nm, 70 nm, 80 nm, 90 nm, 1000 nm, 120 nm, 140 nm, 160 nm, 180 nm, 200 nm, 250 nm, 300 nm, 350 nm, 400 nm, 450 nm, 500 nm, 600 nm, 700 nm, 800 nm, 900 nm, 1000 nm, or ranges therebetween). In some embodiments, the electric potential applied to the electrodes is between 1 kHz and 50 MHz (e.g., 1 kHz, 2 kHz, 5 kHz, 10 kHz, 20 kHz, 50 kHz, 100 kHz, 200 kHz, 500 kHz, 1 MHz, 2 MHz, 5 MHz, 10 MHz, 20 MHz, 50 MHz, or ranges therebetween). In some embodiments, the transported particles are electrons. In some embodiments, the electrons are thermally- or photo-generated in the particle transport layer. In some embodiments, the transport of electrons through the particle transport layer creates direct electric current across the particle transport layer. In some embodiments, the particle transport layer is photo-responsive and illumination alters the direct electric current.

In some embodiments, provided herein are methods of mono-directionally transporting particles through a material, without an overall source-drain bias in the direction of transport, comprising applying regularly-spaced, asymmetrically-shaped, oscillating electric fields within the material.

DETAILED DESCRIPTION

Provided herein are flashing ratchets that produce transport based on the oscillating application of regularly-spaced, asymmetric potentials. In particular, devices are provided that transport particles (e.g., electrons) or other charged entities without the requirement of an overall source-drain bias favoring electron transport.

Figure 1:
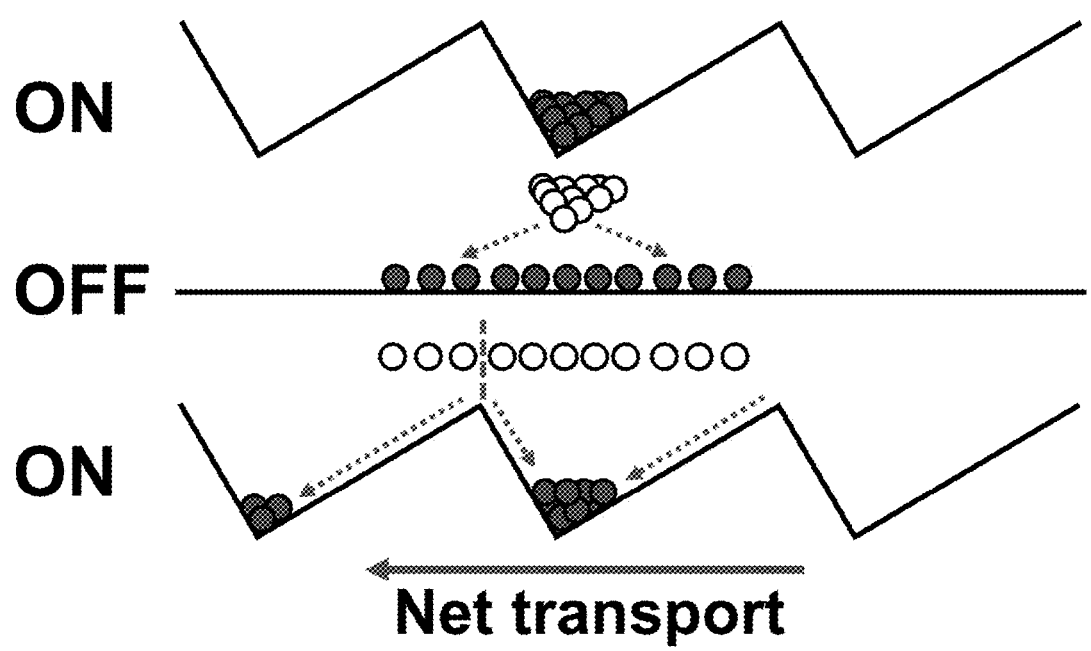
FIG. 1. Operating principle of a one-dimensional on/off flashing ratchet. In the on-state, particles localize in potential wells; in the off-state, particles diffuse isotropically, and then relax asymmetrically when the potential is turned on again.

In some embodiments, provided herein are electron ratchets in which photo- and thermally-generated electrons and/or holes are transported to collecting electrodes. In some embodiments, the electrons are transported without application of an overall source-drain bias. In some embodiments, the electrons are transported against a source-drain bias (i.e., doing work against the bias). In some embodiments, a "flashing" ratchet device is provided in which carriers move directionally within a time-oscillating, periodic potential with locally asymmetric repeat units, created by a shaped electric field applied orthogonal to the direction of transport (e.g., FIG. 1) (refs. 6,9; incorporated by reference in their entireties). Such flashing ratchets provide a motif that is amenable to incorporation into an organic solar cell—for which efficiencies suffer when multiple scattering mechanisms randomize electron transport to collecting electrodes (ref. 16; incorporated by reference in its entirety). Unlike a tilting ratchet, the flashing rachets herein do not operate through application of a source-drain bias. Experiments conducted during development of embodiments herein demonstrating the ratcheting of photogenerated carriers within an organic material to produce power (when no power is produced in the absence of the oscillating potential), indicating that ratcheting is a useful mechanism for improving the efficiency of organic solar cells, not by improving the electrical mobilities of the constituent materials, but rather by utilizing some of the energy lost as heat to power directional charge transport.

In some embodiments, the ratchets herein operate by breaking time-reversal and spatial symmetries in the direction of transport through application of a time-dependent potential with repeating, asymmetric features. In some embodiments, artificial implementations focus on classical particles, ratcheted with simple sawtooth-shaped potentials. Experiments conducted during development of embodiments herein demonstrate the ratcheting of particles (e.g., electrons), generated both thermally and with light, within a highly scattering organic bulk-heterojunction layer, and a device architecture that provides the application of arbitrarily-shaped oscillating electric potentials. Rather than using a voltage or other net bias across the region the particles are to traverse, ratcheted charge carriers are capable of doing work against a bias. Depending on the device, illumination enhances or diminishes the measured current. The systems and devices herein provide powerful tools for investigation of the complex behavior of electron ratchets and find use, for example, in providing efficiencies of soft-material or nanostructured photovoltaics.

Embodiments herein have numerous advantages over existing technologies. In some embodiments, devices herein implement asymmetric potential using shaped electrodes, an approach which allows for the application of arbitrarily-shaped potentials. In some embodiments, devices ratchet photogenerated charge. In some embodiments, devices reacts to light, and are capable of increasing, decreasing, reversing, etc. the current upon the application of light, in an intensity and wavelength dependent manner.

Embodiments herein find use, for example, as light modulated switches; AC to DC current rectifiers; light detectors; light-controlled logic circuits using an external AC signal, where each ratchet device powers, for example, a microLED light, which then modulates another ratchet device, thus coupling input and output; enhancement of current in organic photovoltaics devices (e.g., by improving charge transport and collection); improved performance in non-electron ratchets, used for transporting microspheres, proteins or DNA molecules, separating them based on size or charge; etc.

Previous ratchet implementations used oscillating field that were time-biased. In such ratchets, averaging the temporal function over a cycle results in a non-zero value. Examples of this are an on/off drive (switching between 0 and 1, so that, for equal durations, the average would be 0.5), or $\sin^2(t)$. However, in some embodiments herein, ratchets produce current for unbiased, zero average functions, e.g., a sine wave, or a square wave. Natural sources, such as electromagnetic radiation, are sine waves, and so, some embodiments herein utilize such sources (e.g., radio waves) to easily power ratchets, without needing extra electronic components to bias the function. This design achieves this by allowing the electrons to move up and down in the transport layer, so that the symmetry of the applied function is broken.

Although specific exemplary devices, and components and materials thereof, are described herein (see, e.g., Examples 1-5), the scope of embodiments herein is not so limited. Examples of other materials and components that may find use in embodiments herein, in any suitable combination are described below.

As described herein, in some embodiments, devices comprise a particle transport layer. In particular embodiments, the particle transport layer comprises a bulk heterojunction (BHJ) film. In exemplary embodiments, the thin film BHJ comprises a mixture of P3HT and PCBM. In some embodiments, the thin film BHJ comprises (e.g., in addition to P3HT and PCBM): lithium fluoride (LiF) (e.g., a LiF layer), poly(3,4-ethylenedioxythiophene) (PEDOT), poly(styrenesulfonate) (PSS), PEDOT:PSS (e.g., a PEDOT:PSS layer), etc. Other materials known in the field for use in and/or as a BHJ film find use in embodiments herein (e.g., alone or in combination with the materials described herein).

As described herein, in some embodiments, devices comprise a dielectric layer. In some embodiments, the dielectric material comprises, for example, silicon dioxide ($SiO_2$), undoped silicate glass (USG), fluorosilicate glass (FSG), borophosphosilicate glass (BPSG), a spin-on low-k dielectric layer, a chemical vapor deposition (CVD) low-k dielectric layer, or any combination thereof. The term "low-k" denotes a dielectric material that has a dielectric constant of less than silicon dioxide. In another embodiment, a self-planarizing material such as a spin-on glass (SOG) or a spin-on low-k dielectric material such as SiLK™ is used as the dielectric material. The use of a self-planarizing dielectric material may avoid the need to perform a planarizing step. In some embodiments, the dielectric material is formed utilizing a deposition process including, for example, chemical vapor deposition (CVD), plasma enhanced chemical vapor deposition (PECVD), evaporation, spin-on coating, etc. Other dielectric materials include polymers or plastics, such as TEFLON, polypropylene, polyethylene, etc.; materials, such as glass, epoxy, porcelain (ceramic), mica, polyimide, etc.; dielectric alloys, such as alumina, magnesium titanate, barium titanate; and gases, such as argon, nitrogen, air, etc. Other dielectric materials known in the field and/or combinations of dielectric materials also find use in embodiments herein.

As described herein, in some embodiments, devices comprise an electrode layer. In some embodiments, the electrode layer comprises an array of electrodes (e.g., linearly-arranged, regularly-spaced). Exemplary conductive materials for the electrodes include copper, silver, gold, platinum, aluminum, palladium, cadmium, lithium fluoride, molybdenum oxide, and other conductive metals, alloys, etc. Other conductive materials known in the field and/or combinations of conductive materials also find use in embodiments herein.

EXPERIMENTAL

The following examples describe the fabrication, testing, and characterization of exemplary ratchet devices. Experiments conducted during development of embodiments herein are also described in Kedem et al. (Proc Natl Acad Sci USA. 2017 Aug. 15; 114(33):8698-8703) and Kedem et al. (Nano Lett. 2017 Sep. 13; 17(9):5848-5854), both of which are herein incorporated by reference in their entireties.

Example 1

Exemplary Ratchet Device

The ratchet is configured similarly to a field-effect transistor in the co-planar (bottom contact) bottom gate configuration (FIGS. 2A-B, 5, and 6), with a channel length of 12 μm and channel width of 500 μm. The transport layer is a 200-400-nm-thick bulk heterojunction (BHJ) film (1:1 blend of P3HT:PCBM, poly(3-hexyl-thiophene-2,5-diyl):[6,6]-phenyl-$C_{61}$ butyric acid methyl ester), commonly used in organic photovoltaic systems, which produces mobile electrons and holes upon dissociation of photoexcited states. There is no applied source-drain bias or equivalent difference in the work-functions of the identical Ag source and drain electrodes, and there are no carrier-blocking interfacial layers; this device is not a diode. Rather, it is designed such that directional current is only achieved by ratcheting electrons along an oscillating potential surface created by an array of eight "finger" electrodes (FEs) with an asymmetric thickness profile along the direction of transport, fabricated using focused-ion-beam (FIB) assisted deposition, FIG. 2 Panel C.

Figure 8:
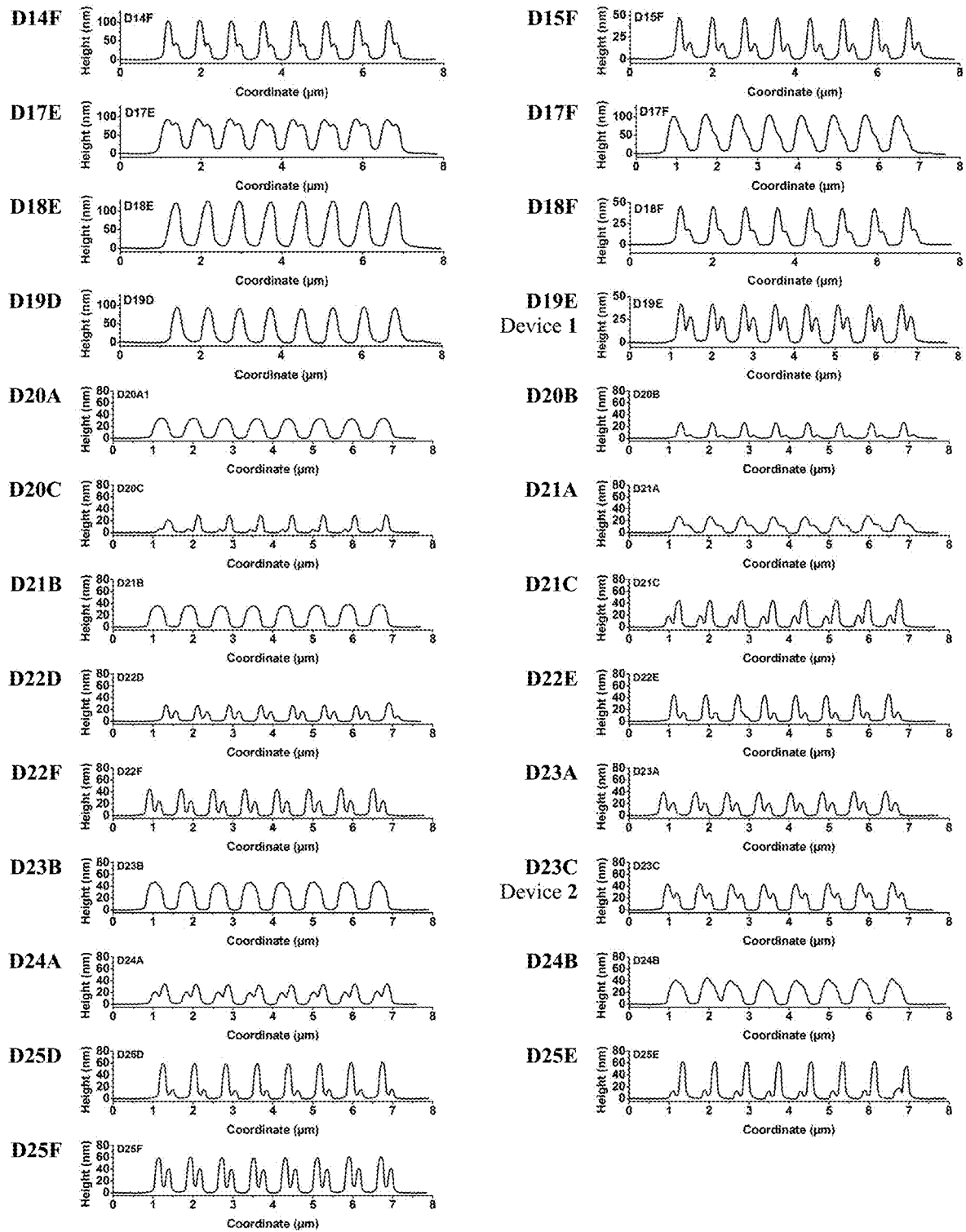
FIG. 8. AFM line scans of the FE arrays of the fabricated devices.

The FE shape directly determines the shape of the applied electric field G(x) (FIG. 2D). By oscillating the potential applied to the FEs as $F(t)=V_0+A \sin(2\pi tf)$, where A is the amplitude, f is the flashing frequency, and $V_0$ is a constant offset, we obtain a flashing ratchet potential, $V(x,t)=G(x)\cdot F(t)$. $V_0=0$ V unless otherwise noted, and thus the mean applied potential in all parts of the BHJ film is zero. A feature of the device architecture is the ability to produce a wide variety of potential shapes (FIG. 8), unlike flashing electron ratchets which only apply a saw-tooth shaped electric field (ref. 13; incorporated by reference in its entirety). This approach allows shape-independent ratchet behaviors, and provides a platform to produce complex shape-dependent behaviors of ratchets.

Figure 9:
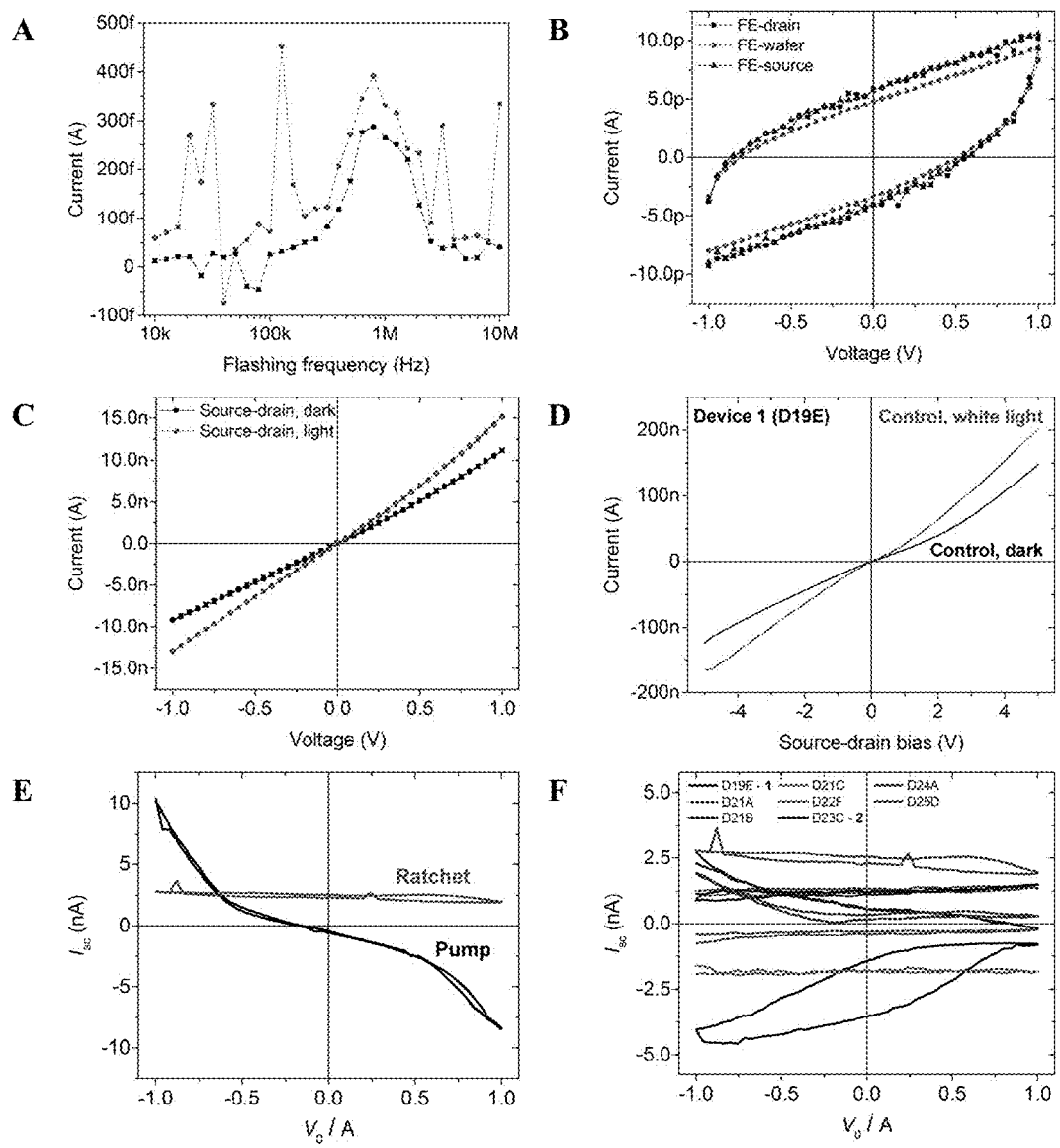
FIG. 9. (Panel A) Current as a function of flashing frequency for two devices without a BHJ layer. (Panels B,C) Current vs. voltage sweeps for an exemplary device, (Panel B) between the finger electrode contact and the drain, the source or the wafer itself, showing typical capacitor charging behavior, and (Panel C) between the source and drain, with and without illumination by a microscope illuminator, showing photoconductivity. (Panel D) Source-drain current, with and without illumination, for device 1, across a wider voltage range. (Panel E) Current (at zero source-drain bias) vs. $V_0$/A, the ratio of the DC offset and the amplitude of the flashing potential, for a typical ratchet device, and a pump-type single-FE device (FIG. 6H); f=100 kHz, A=5 V. (Panel F) Current (at zero source-drain bias) vs. the ratio of the DC offset and the amplitude, for several devices, including devices 1 and 2 (indicated); f=100 kHz, A=5 V.
Figure 12:
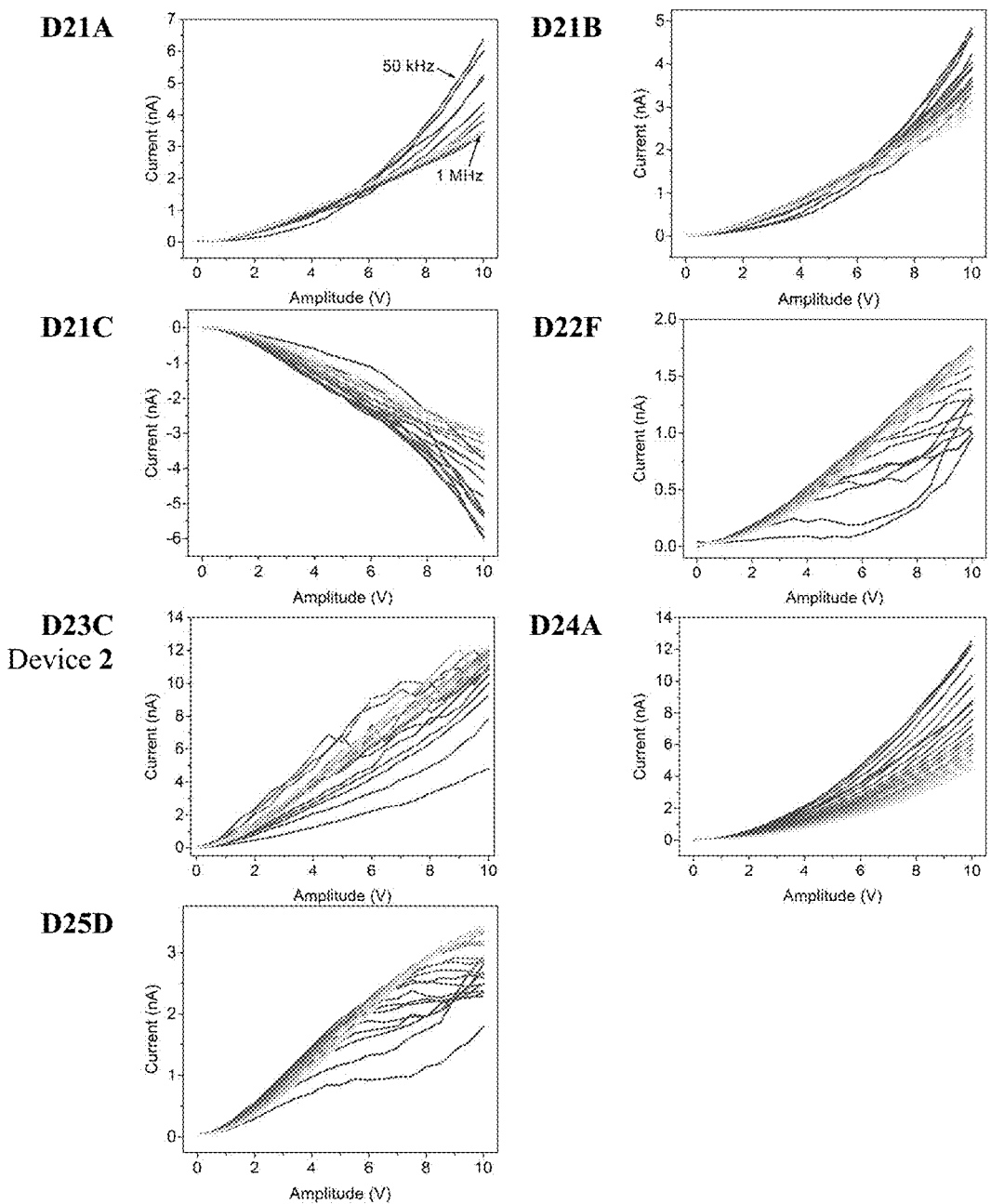
FIG. 12. Current as a function of amplitude for 20 flashing frequencies, from 50 kHz (blue) to 1 MHz (yellow) for seven devices (indicated), in the dark. The lowest amplitude (x-axis) value plotted here is 0.01 V; such a low amplitude is equivalent to the absence of a flashing potential.
Figure 13:
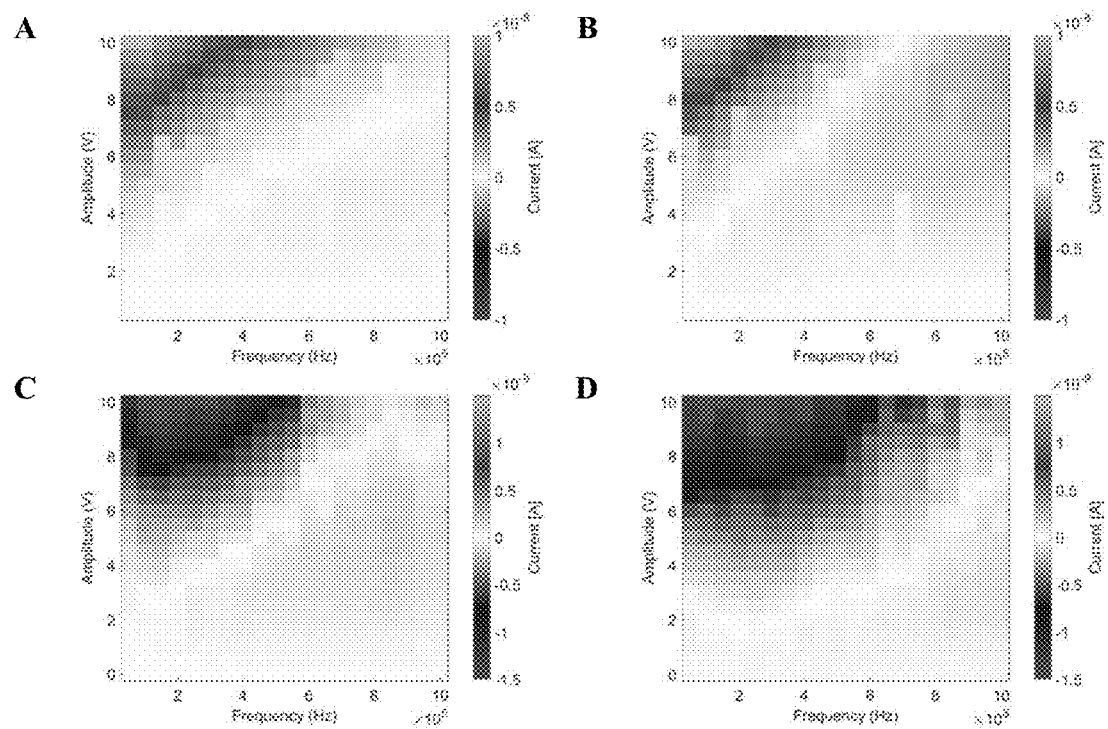
FIG. 13. Short-circuit current vs. frequency and amplitude, for (Panels A,B) device D14 F (see FIG. 8), (Panel A) in the dark and (Panel B) under illumination by a 150 W halogen microscope illuminator; and for devices (Panel C) D24 B and (Panel D) D25 F, both in the dark.
Figure 14A:
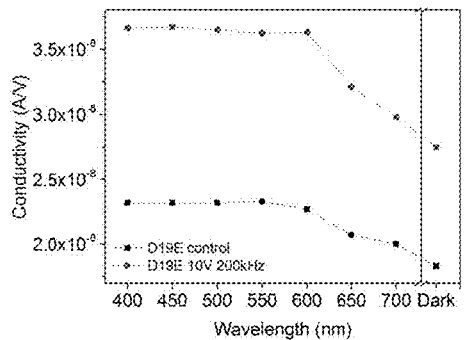
FIGS. 14A-B. Results of linear fits to current-voltage (IV) scans for seven devices (indicated), in the dark, and under illumination by 0.28 mW/cm² light at seven different wavelengths (indicated). Left—the slope of the line (e.g., the conductivity, without ("control") and with ("10V 100 kHz" or "10 V 200 kHz") the flashing electric potential; right column—the short-circuit current $I_{SC}$ and open-circuit voltage VOC (reverse scale). Devices marked with "2", e.g., D21 A2, have had BHJ film dissolved and redeposited with a lower, 5 mg/mL concentration of 1:1 P3HT:PCBM, 1.5% DIO FIG. 15. Measured current vs. time, for device 1, in the dark, and when illuminated (shaded areas) by 532 nm light at different intensities (indicated); f=500 kHz, A=10 V.
Figure 14A:
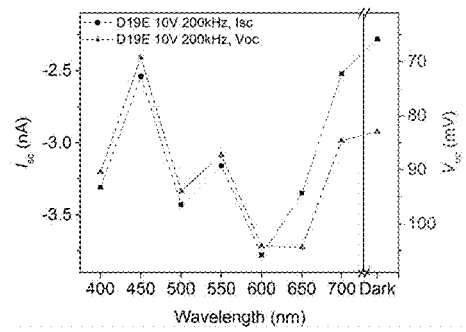
Figure 14A:
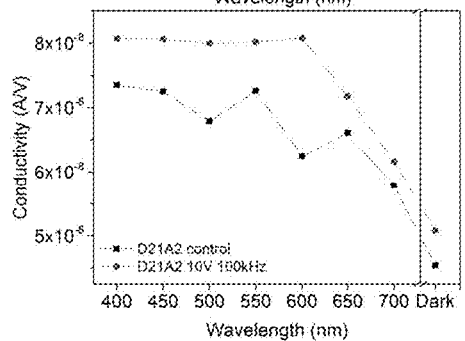
Figure 14A:
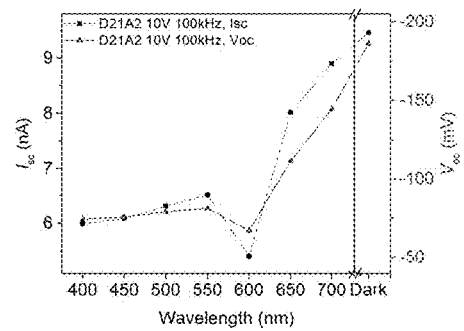
Figure 14A:
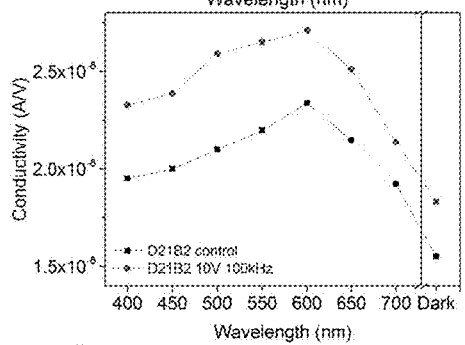
Figure 14A:
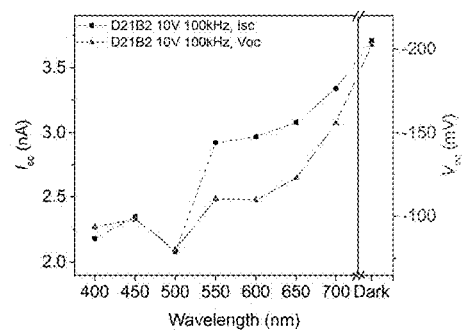
Figure 14A:
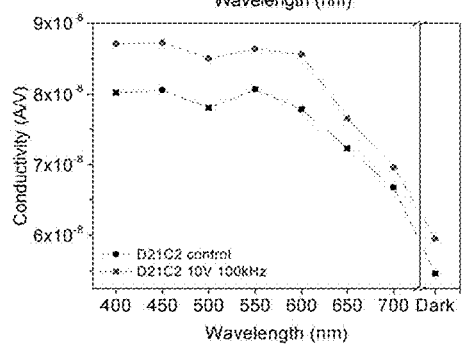
Figure 14A:
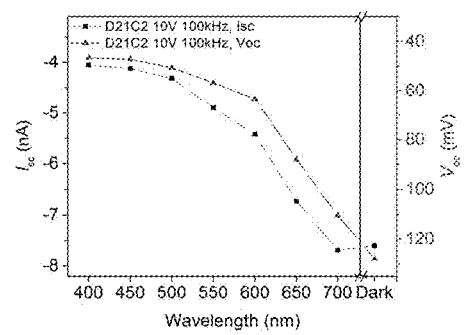
Figure 14B:
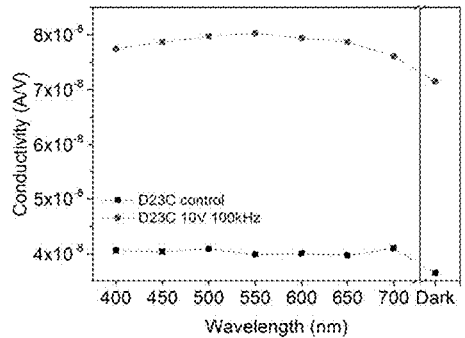
Figure 14B:
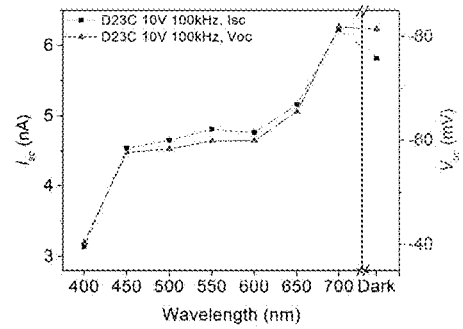
Figure 14B:
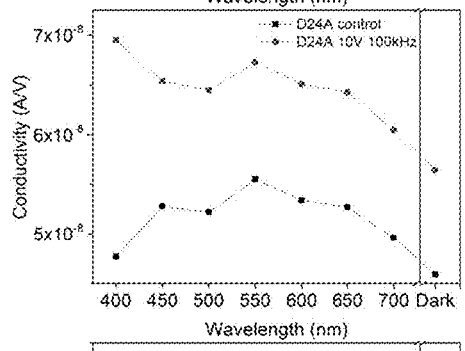
Figure 14B:
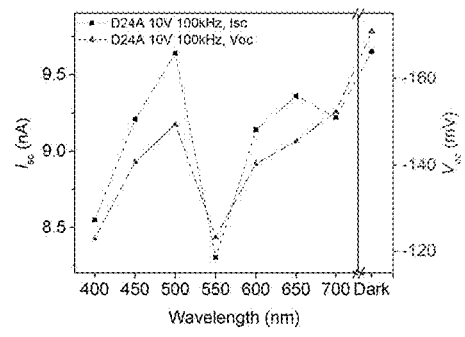
Figure 14B:
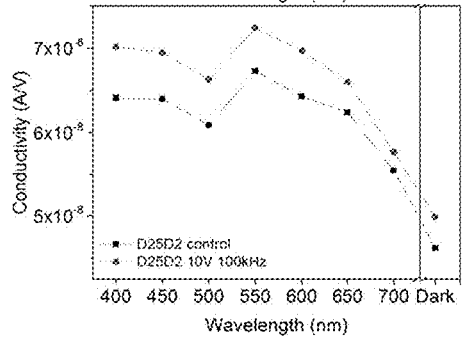
Figure 14B:
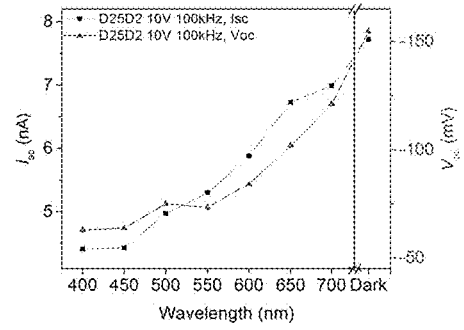

Twenty five devices were fabricated during experiments conducted during development of embodiments herein. All parameters were held constant except the shape of the finger electrodes and the BHJ thickness. All 25 of the devices were active ratchets, even in the dark, producing source-drain currents on the order of 1-10 nA at zero bias, in the presence of an oscillating potential. These currents are of typical magnitude for P3HT:PCBM devices in a similar FET configuration under a ~50-100 mV source-drain bias, with zero gate potential (ref. 21; incorporated by reference in its entirety). The data indicates that ratcheting of charge carriers is the source of these currents: (i) in the absence of a flashing potential or a BHJ layer, no current is observed (FIGS. 9A, 12); (ii) the current displays a strong dependence on the flashing frequency, characteristic of ratchets (ref. 6; incorporated by reference in its entirety), (iii) in some cases, the current changes direction with changes in amplitude or frequency, also characteristic of ratchets (refs. 6,22; incorporated by reference in their entireties), or with illumination (FIG. 13); (iv) the flashing frequency producing the peak current, and the magnitude of the current, depend on the ratio of P3HT:PCBM in the BHJ blend (FIG. 16); and (v) the current is largely insensitive to the offset of the potential, $V_0$, which rules out an electrical short between the FEs and the source or drain electrodes (FIG. 9 Panel F). Experiments conducted during development of embodiments herein also indicate that the current attributed to ratcheting is not capacitively coupled current rectified by the ammeter.

Figure 3:
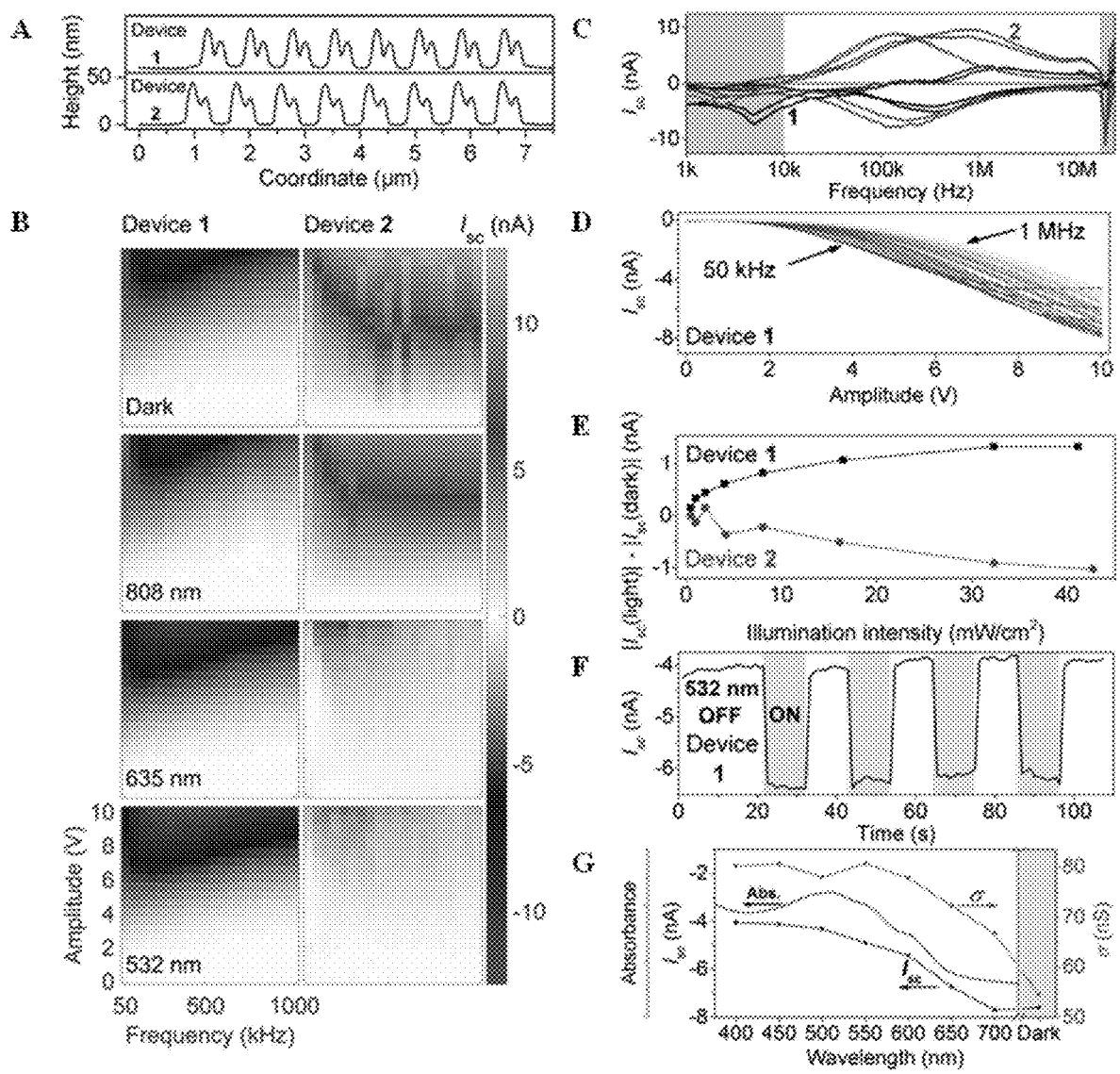
FIG. 3A-G. Ratcheting of charges in two exemplary devices under short-circuit conditions. (A) AFM line scans of the finger electrodes of two devices, 1 and 2. (B) Short-circuit current, $I_{sc}$ vs. flashing frequency and amplitude in the dark, and for illumination at different wavelengths, at 4.5 mW, for devices 1 and 2. (C) Bi-directional sweep of $I_{sc}$ vs. flashing frequency in the dark, A=10 V, for several devices, including devices 1 and 2 (indicated); unstable currents at the low end and a resonance peak at the high end (shaded areas) are observed. (D) $I_{sc}$ vs. amplitude for device 1, in the dark, for various frequencies. (E) $|I_{sc}|$ at different illumination intensities, relative to dark; f=500 kHz, A=10 V, λ=532 nm. (F) $I_{sc}$ vs. time for device 1, with (shaded) and without illumination with a 532-nm laser at 4.5 mW; f=1 MHz, A=10 V. (G) Conductivity (σ) and short-circuit current ($I_{sc}$), vs. excitation wavelength for a representative sample (Device D21 C), displayed with the corresponding BHJ's absorbance spectrum; the values of σ and $I_{sc}$ were obtained by linear fits to I-V curves, and the error bars from the fits are too small to be seen.

FIG. 3 shows the shapes of the FE arrays for two representative devices, "1" and "2", measured by atomic force microscopy, and their photo-electrical characteristics, all under short-circuit (zero source-drain bias) conditions. The direction of current depends on the device, and on operating parameters such as frequency and amplitude (FIG. 3 Panels B-D). It is contemplated that the ratchets herein operate via a catch-and-kick mechanism (ref. 23; incorporated by reference in its entirety); the oscillating potential not only maintains the system far from equilibrium, but also alternately traps and accelerates the electrons so that they can relax asymmetrically and produce current; although embodiments herein are not limited to any particular mechanism of action and an understanding of the mechanism of action is not necessary to practice such embodiments. The frequency of switching is near-resonant with some characteristic timescale(s) of electron motion, or else the electron will remain permanently trapped or will see an average potential surface, both of which result in zero current. Indeed, the measured current strongly depends on the frequency of the flashing potential, and the strongest currents were observed in the 100 kHz-1 MHz frequency range (FIGS. 3C and 11), which is reasonable given the mobility of charges in the BHJ film. Additionally, for all devices, (0-to-peak) amplitudes, A, of less than ~2 V are too weak to effectively trap and accelerate the electrons. Higher amplitudes increase the current in general, but for some devices and frequencies, the current saturates at amplitudes above 8 or 9 V (FIG. 3 Panel D and 12).

Figure 4:
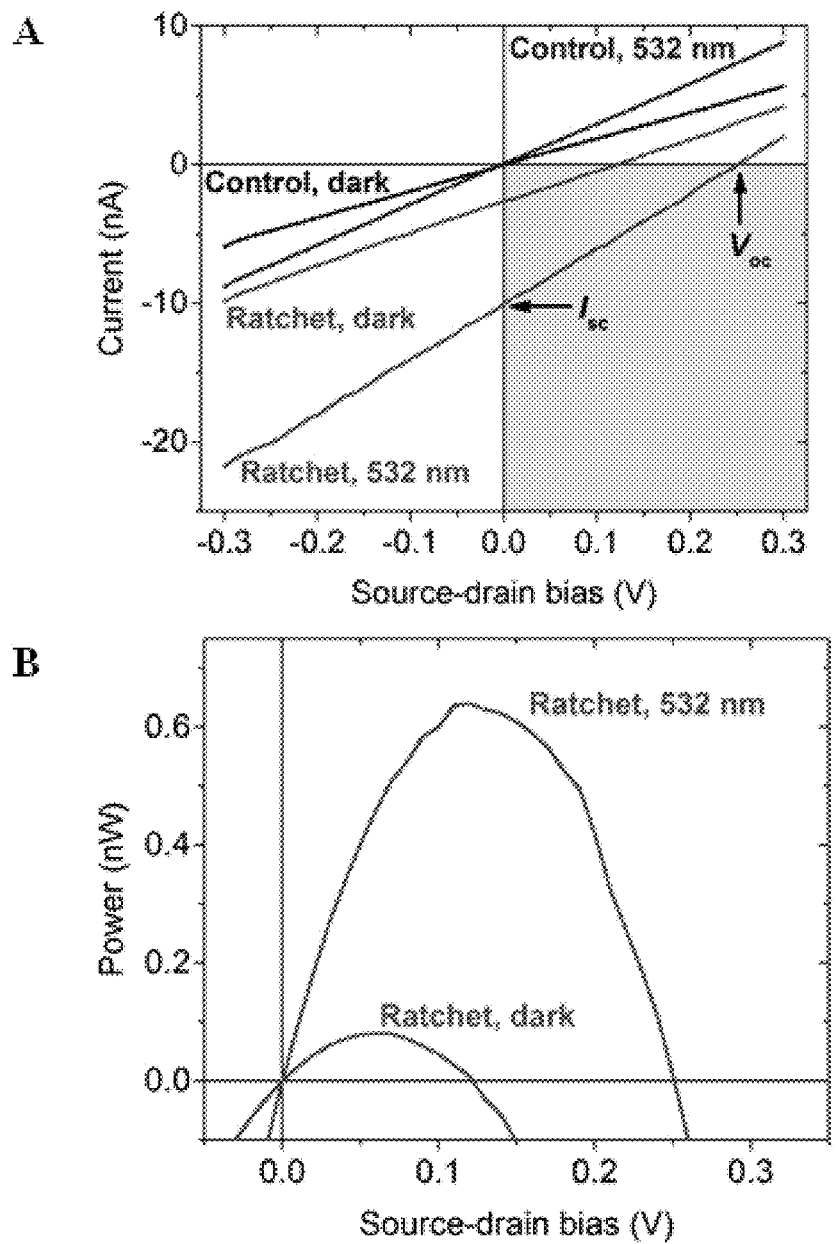
FIG. 4. Ratchets doing work. (Panel A) Current-voltage (I-V) scans of device 1 with ("532 nm") and without ("dark") illumination, and with ("Ratchet") and without ("Control") the flashing potential; the device only produces a short-circuit current $I_{sc}$ and an open-circuit voltage $V_{oc}$ with the flashing potential. In the lower right quadrant (shaded), the ratchet is doing work. (Panel B) The DC power ($P_{out}$=I×V) produced by this ratchet, with and without illumination; for the data in A and B, f=500 kHz, A=10 V.
Figure 5:
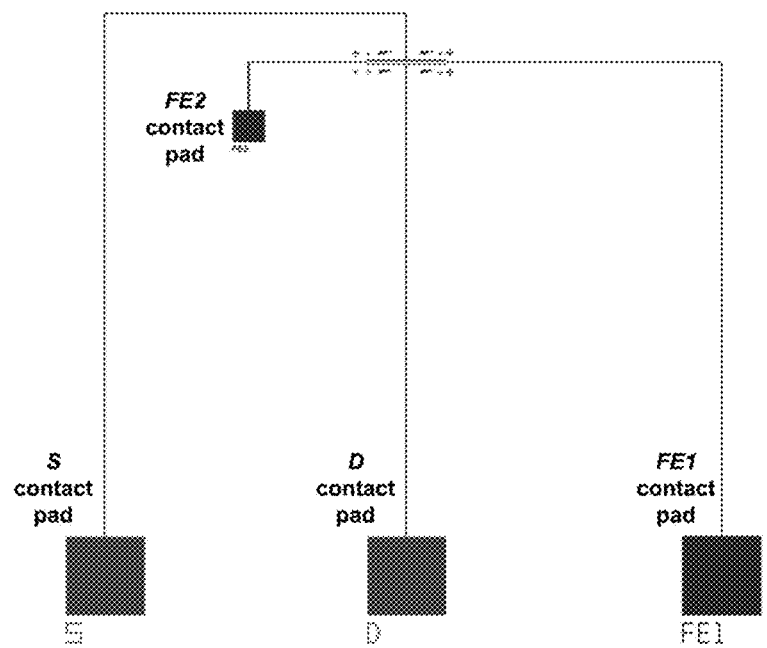
FIG. 5. (Panel A) Schematic layout of an exemplary system. The S, D and FE1 contact pads are 500×500 μm²; the FE2 contact pad is smaller, at 200×200 μm², and is used to verify the finger electrodes were deposited correctly. (Panel B) Scheme of the active area in detail (the alignment crosses and resolution markers were removed for clarity). (Panel C) Simplified wiring diagram of the system. The drain electrode is connected directly to the common (chassis) ground; the current is measured between the source electrode and the common ground; and the oscillating potential is applied by a function generator connected between the finger electrode array and the common ground.
Figure 5:
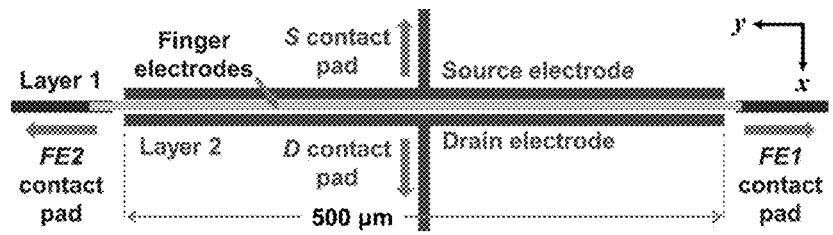
Figure 5:
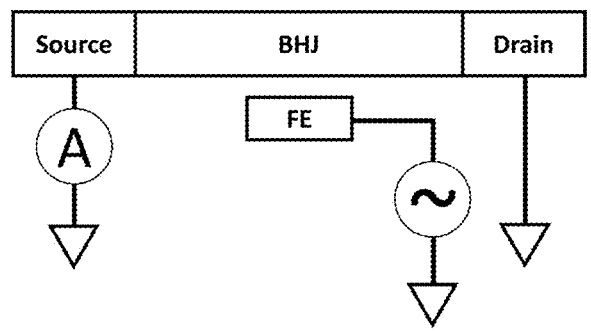

Illumination either enhances or diminishes the ratchet current relative to the dark (FIG. 3 Panel B), depending on the specific device, even though the light application creates additional charge carriers in the devices tested, as evident from I-V curves under both conditions, FIG. 4 Panel A ("Control" curves). The magnitude of the photoresponse at 0 V ($|I_{sc}(light)|-|I_{sc}(dark)|$) depends on the wavelength of illumination, roughly according to the BHJ's absorption spectrum (FIG. 3 Panel G). The photoresponse saturates at an illumination intensity of ~30 mW/cm² for both devices (FIG. 3 Panel E); this intensity is higher than that of solar irradiation at any single wavelength. These findings demonstrate a non-linear, non-monotonic dependence of the current on the carrier density. The photoresponse raises indicates a utility of utilizing ratchets as photo-switches (FIG. 3F) in electro-optical circuits. A ratchet is engineered to increase, decrease or even reverse the direction of current with illumination (e.g., FIG. 13), making it a highly versatile component.

To demonstrate that the ratchet performs work, a bias was apply between the source and drain electrodes, and the current was measured (FIG. 4A). Without a flashing potential, a linear response was observe over the small voltage range. Illumination increases the current, as expected, for all of the devices, but none produce open-circuit voltage, $V_{oc}$, or short-circuit current, $I_{sc}$, another expected result given that the device is not a photodiode. When a flashing potential is applied, the devices produce non-zero $I_{sc}$ and $V_{oc}$ and transport electrons against an applied bias (FIG. 4A, "Ratchet" curves). Illuminating the device increases or decreases these parameters (depending on the specific device, FIG. 3), even though all devices are more conductive under illumination with wavelengths at which the BHJ absorbs the most, FIGS. 3G, 18. For device 1, the maximum DC power output ($P_{out}$=I×V) is ~0.64 nW. To quantify the power input from the AC flashing potential, the system was treated as a capacitor, where the two plates are the FE array and the BHJ layer, FIG. 5C. The applied potential charges and discharges the capacitor, and the loss in that process is $P_{loss}=V_{rms}^2 \cdot 2\pi f \cdot C \cdot DF$, where $V_{rms}$ is rms voltage, f is oscillation frequency, C is capacitance, and DF is the dissipation factor (ref. 24; incorporated by reference in its entirety). The latter two quantities were measured for the frequencies used in this study for multiple devices (FIG. 17); their typical values are C=1.3 pF and DF=0.25%. For A=10 V and f=500 kHz, $P_{loss}$=510 nW. The 532-nm laser illumination at the highest power contributes ~380 nW, so the power conversion efficiency of device 1 in FIG. 4s, $$\eta = \frac{P_{out}}{P_{light} + P_{loss}} = 0.07\%.$$

Figure 17:
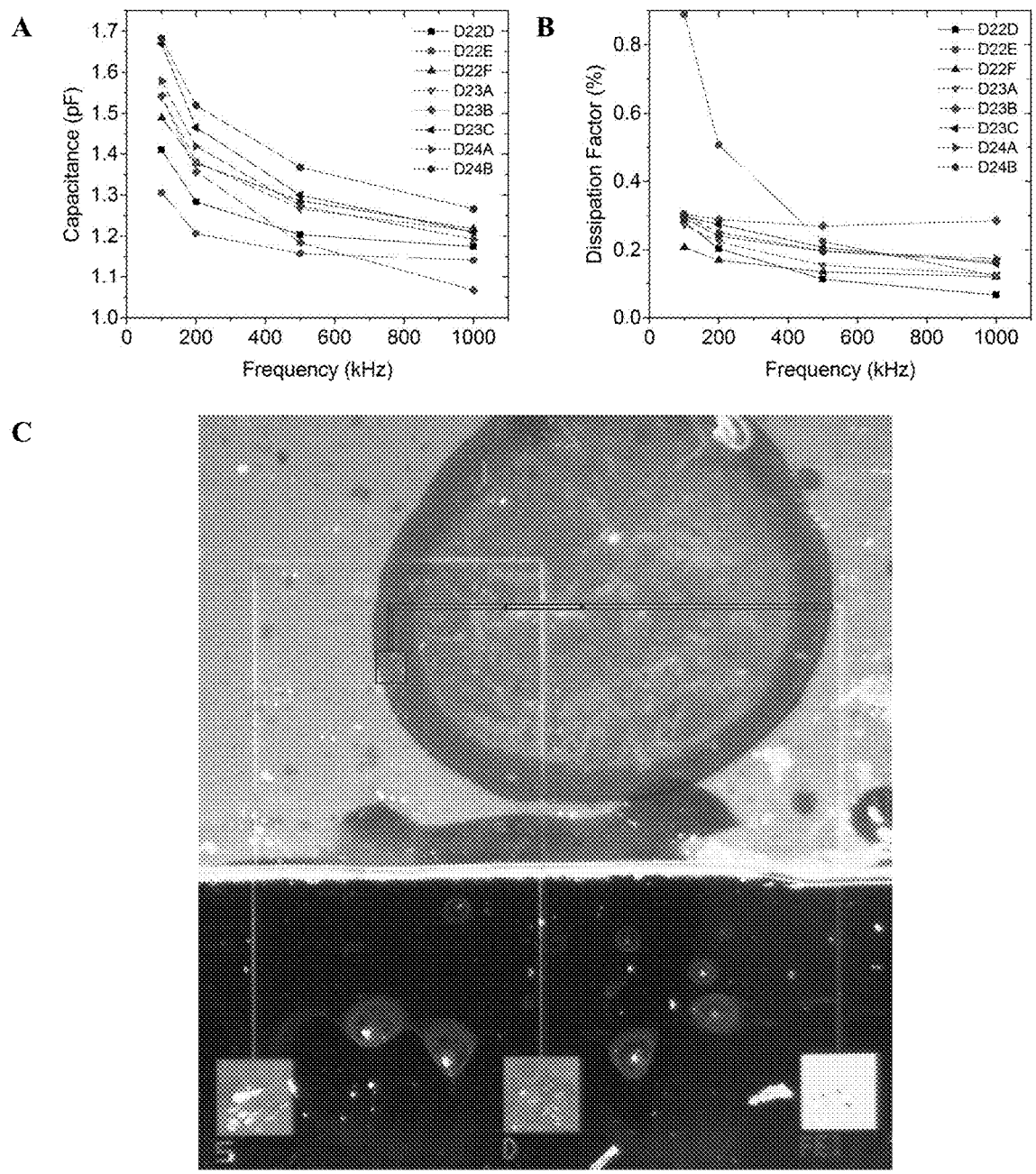
FIG. 17. (Panel A) Capacitance and (Panel B) dissipation factors of several devices for different oscillation frequencies, at an oscillation amplitude of 2 V, without illumination (the values change by less than 1% when illuminated by a 150 W halogen microscope illuminator). (Panel C) Optical microscopy image of one device (D25 E), showing the contact pads at the bottom (each 500×500 μm²), and the active area, covered by the BHJ film, and a glass cover slip, at the top. Boxes highlight the active area and areas where the FE contact line or FE2 contact pad overlap with the BHJ film.
Figure 18:
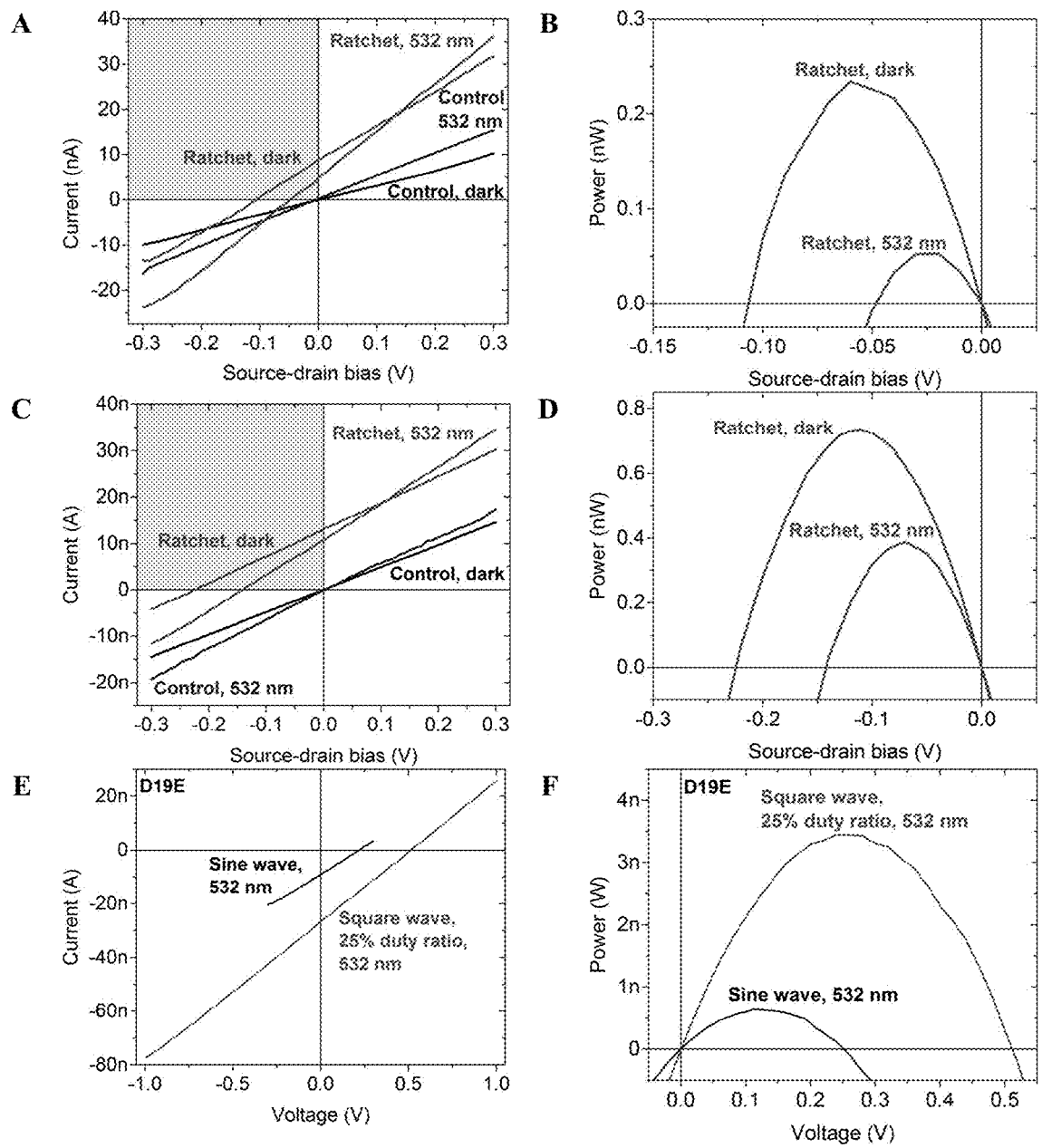
FIG. 18. (Panel A) Current-voltage (IV) scans of, and (Panel B) the power produced by device 2 with ("532 nm") and without ("dark") illumination, and with ("Ratchet") and without ("Control") the flashing potential; f=200 kHz, A=10 V. (Panels C,D) Same as A,B, for device D24 A, f=100 kHz, A=10 V. (Panel E) Current-voltage scan of, and (Panel F) the power produced by device 1 (D19 E) under illumination by a 532-nm laser with a flashing potential at f=200 kHz, A=10 V, oscillated in time as a sine wave, or as a 25% duty ratio square wave (the potential is positive for 25% of the duration of each cycle, and negative the rest of the time, with 9 ns rise and fall times).

The highest efficiency we measured was 0.49%, for a device in the dark that produces its peak current at a lower frequency, which translates into smaller $P_{loss}$ (FIG. 18 Panels C,D). Substantial improvements in efficiency are achievable with optimization of the device architecture and flashing potential such as: (i) flashing the potential as a 25%-duty ratio square wave, as opposed to a sine wave, which increases the power produced five-fold, FIG. 17 Panels E,F; (ii) depositing the BHJ selectively over the active area of the device, to decrease the capacitance, which improves efficiency by up to a factor of 20; and (iii) tuning the thickness of the BHJ film to better match the permeation length of the applied field, and the optical thickness under illumination.

Experiments conducted during development of embodiments herein demonstrate remarkable power production by the tested devices in the presence of a time-averaged-zero field. The ratchet produces a $V_{oc}$, likely due to formation of fields due to carrier accumulation at the BHJ/contact interfaces, which induces diode-like behavior even though the source and drain contacts are identical; although embodiments herein are not limited to any particular mechanism of action and an understanding of the mechanism of action is not necessary to practice such embodiments.

Ratcheting is a fundamentally different mechanism of electron motion than is traditional conduction in a DC field, and a mechanism that works in high-scattering environments like organic and nanostructured materials. The ratchets developed and tested herein produce enough current and voltage to act as passive logic elements within optoelectronic circuits (ref. 25; incorporated by reference in its entirety), for instance by using one ratchet to drive a micro-LED, which in turn controls the output of another ratchet, exploiting the sensitivity of the electrical characteristics of our ratchets to light. In some embodiments, the ratchets herein combined with an antenna, find use in rectifying radio-waves to remotely power nanoelectronic circuits (ref 26; incorporated by reference in its entirety). The devices herein are well-suited for these applications, for at least the reason that the design utilizes only a single AC source, does not require a static gate electrode, and utilizes light in addition to frequency to control current and voltage. In a ratchet configured with an oscillating field that also powered by light, directly or indirectly, ratcheting serves as an additional photovoltaic mechanism, and yields a non-incremental increase in the efficiencies of soft-material or nanostructured solar cells and other active light-harvesting devices. In some embodiments, a light-powered ratchet utilizes plasmonic structures embedded in the active material to concentrate optical fields into an asymmetric potential surface, using methodology already employed for enhancing light absorption in solar cells (ref. 27; incorporated by reference in its entirety).

Example 2

Fabrication

Etching the Backs of the Wafers

The oxide was etched from the backs of the wafers, using a Samco RIE-10NR reactive ion etcher (20 sccm CF4, 3.3 Pa, 20 min at 200 W following by 5 min at 100 W), to allow formation of electric contact through the back of the wafer (for testing for electrical shorts and capacitance).

Au Contact Lines and Contact Pads for the Finger Electrodes

Maskless photolithography was performed using a Heidelberg μPG501 Maskless Aligner, to define contact lines (10 μm wide) and contact pads (500×500 μm2 and 200×200 μm2) for the finger electrode array (blue layer in FIG. 5A, B). The positive photoresist Shipley Microposit S1813, deposited on the wafer by spin coating (45 sec @ 6000 rpm, 2000 rpm/sec ramp), followed by a 1 min baking step on a hot plate at 110° C. Following exposure (20 ms, −2 defocus), the wafer was developed in a MF319 developer for ~20-30 sec. 10 nm of Ti was then deposited (as an adhesion layer) and 40 nm of Au using an AJA electron-beam physical vapor depositor (EB-PVD), and lift-off was performed by sonication in acetone (FIG. 6 Panel A).

Pt Finger Electrode Array

Figure 2:
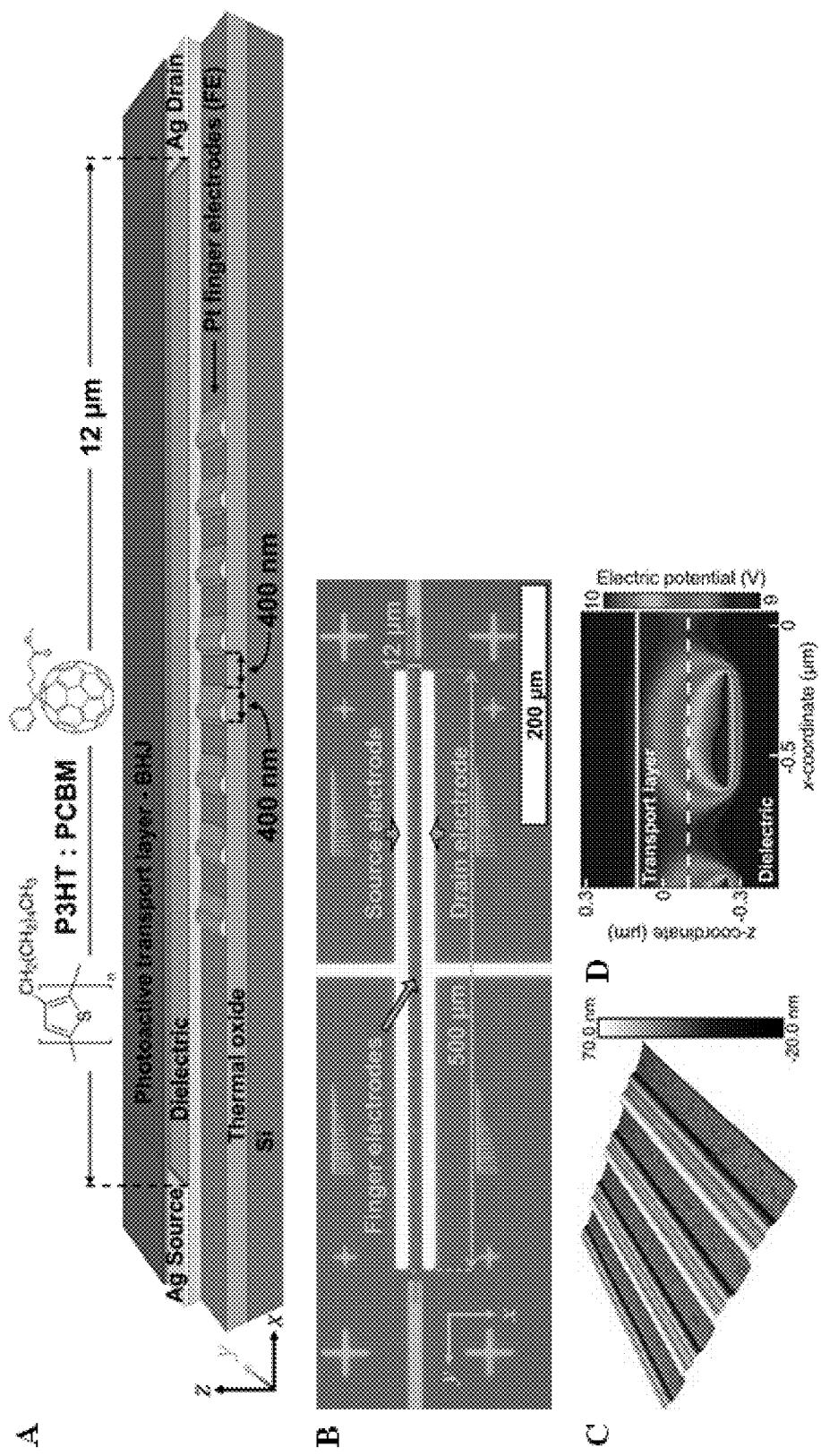
FIG. 2. Design of exemplary ratchet device. (Panel A) Eight asymmetric Pt finger electrodes (FE), 500 μm long, 400 nm wide, ~50 nm thick and with an 800 nm periodicity, apply an electric field to the transport layer comprising a 1:1 mixture of the organic semiconductors shown; the current is measured between Ag source and drain electrodes. (Panel B) Optical microscopy image of the active area of one device prior to BHJ deposition. (Panel C) AFM scan of the FEs of one device. (Panel D) Simulated electric potential around one FE, for V=10 V.
Figure 6:
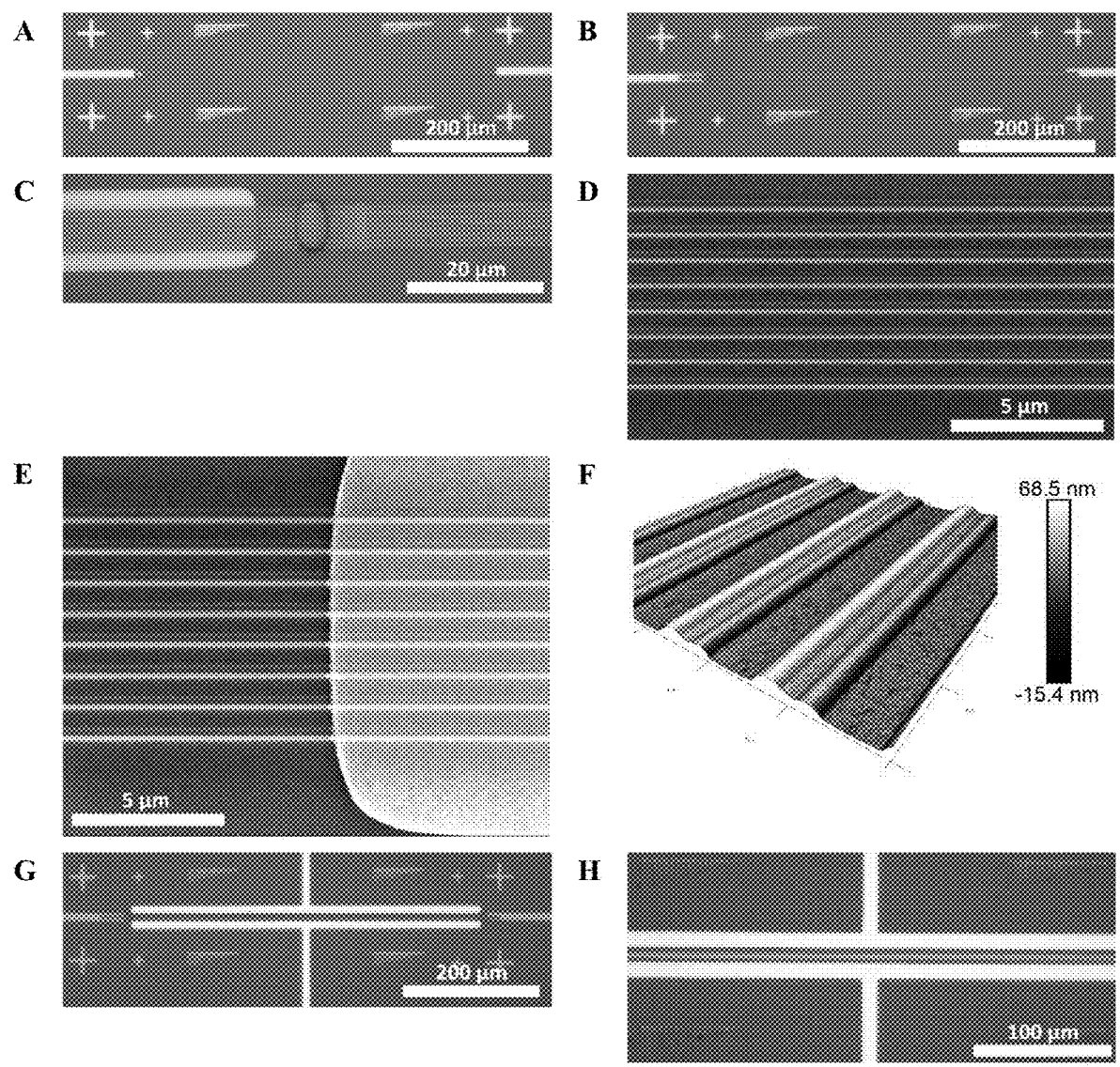
FIG. 6. (Panels A-H) Optical microscopy image of a representative device after (Panel A) the first photolithography step, forming the Au contacts for the finger electrode array; (Panels B,C) FIB deposition of the Pt finger electrode array. In panel C, a small Au block is visible just to the right of the Au contact line, and this block is used to align the FE array. (Panels D,E) Scanning electron microscopy images of the FE array following FIB deposition. (Panel F) AFM scan of a section of the FE array of device 2. (Panel G) Optical microscopy image of a device following the second photolithography step, which forms the Ag source and drain electrodes. (Panel H) Optical microscopy image of a pump-type device, with a single off-center Au electrode, with a rectangular, symmetric height profile.

Focused ion beam (FIB) Pt deposition was performed using an FEI Helios Nanolab 600 FIB, with Ga+ ions at 30 kV and 48 pA, to deposit eight identical finger electrodes (FEs) with an asymmetric thickness profile, 400 nm wide and 572.5 μm long, spaced 400 nm apart (FIG. 6 Panels B-F). In the FIB software, every FE was defined as six blocks of different heights, 50 nm in width each, for a total of 300 nm. The spread of the Pt deposition resulted in each FE being approximately 400 nm wide. The electrodes were deposited in twelve 50 μm sections, which include an 8 μm cross-bar connecting the individual FEs, so that a break in an FE in one section does not make it inoperable for the entire length of the device. Following every section, the Pt precursor gas needle was retracted, the stage was moved, the needle was reinserted, and the next section was deposited with a 2.5 μm overlap with the previous section. Depositing the FEs in shorter sections enabled us to use higher magnification (×2000), and so more accurate deposition, compared to using low magnification. The first and last sections partly overlay the Au contact lines, to form electrical contacts (FIG. 2 Panel B). The entire process was done automatically, using the RunScript program from FEI. A typical array deposition took 30-60 minutes, depending on the amount of Pt deposited.

Dielectric Layer

Figure 7:
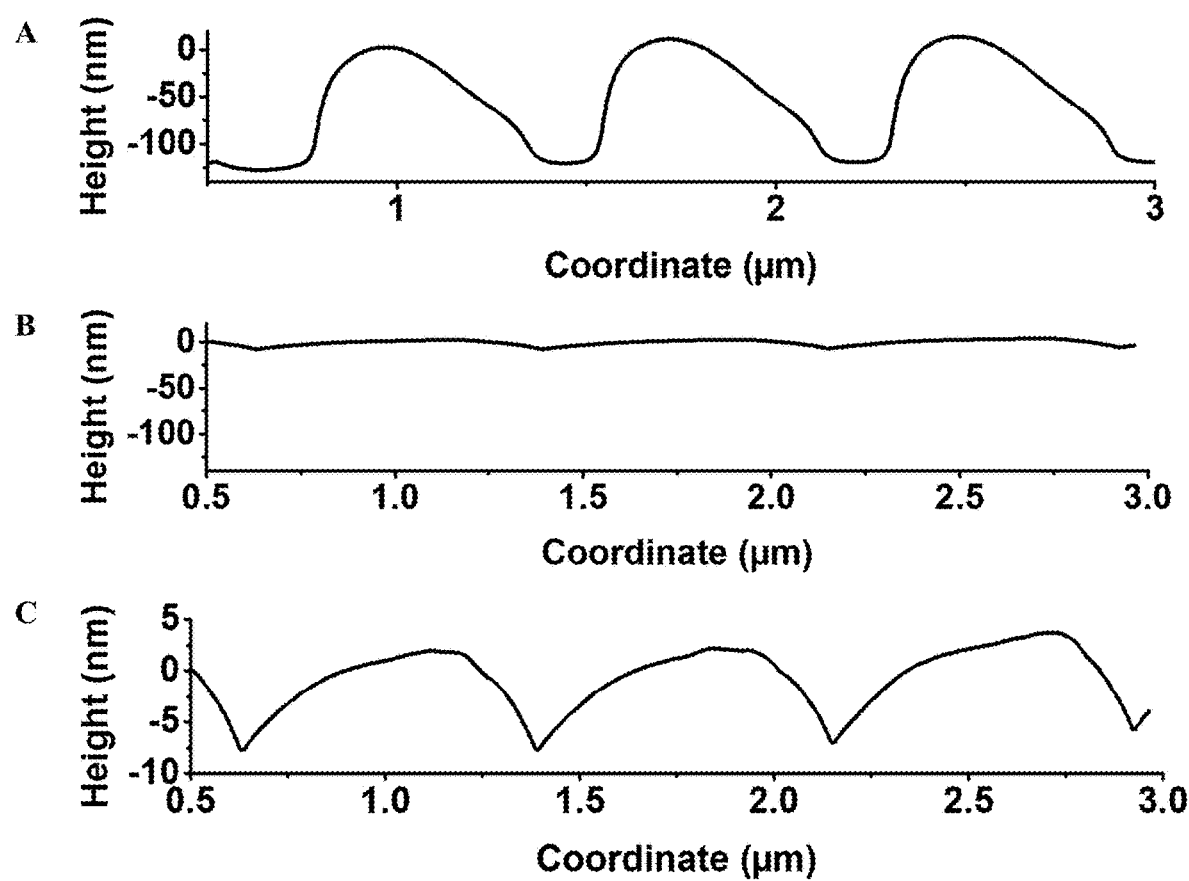
FIG. 7. AFM line scans of a sample used to test the effectiveness of the SOG planarization step (Panel A) after FIB milling and Pt deposition and (Panels B,C) after planarization with a PECVD $SiO_2$/spin-on-glass/PECVD $SiO_2$ sandwich, at (Panel B) the same scale as A and (Panel C) a smaller scale.

The dielectric layer is a sandwich structure of Plasma Enhanced Chemical Vapor Deposition (PECVD) SiO2/spin-on-glass (SOG)/PECVD SiO2. The SOG layer is critical, as it planarizes the surface. A simple PECVD SiO2 layer is deposited conformally, and has the same topography as the underlying finger electrodes. In that case, there is no potential gradients, as the distance from the FE to the BHJ layer would remain constant. The SOG layer is sandwiched by PECVD $SiO_2$ to improve its stability, and facilitate the next processing steps—the wettability characteristics of a bare SOG layer made it nearly impossible to spin-coat photoresist on it. Approximately 13 nm of $SiO_2$ was deposited using an STS LpX PECVD, using the following parameters: 900 mTorr, 1420 sccm N2O, 500 sccm SiH4, 30 W HF, 20 sec, 300° C. plate temperature, 250° C. showerhead temperature and a chamber wall temperature of 75° C. The SOG layer was fabricated using 11F SOG solution diluted with isopropanol to 50% of the original concentration. Immediately prior to the first SOG layer, the spin-coating process was run once with isopropanol, to both clean the wafer, and produce a slight vapor pressure of isopropanol in the spin coater. Two layers of SOG were spin-coated using the following recipe: (i) ~1 mdrop placed on the wafer, (ii) 5 sec at 3000 RPM (2000 RPM/sec ramp up/down), (iii) 9 sec rest, followed by 1 min baking steps on hot plates at 85, 155 and 255° C. A two-layer process is known to improve planarization compare to a single layer of equivalent thickness, and the same improvement was indeed observed. Following the two spin-coating and baking cycles, the wafer was cured for 1 hr at 425° C. (1° C./sec ramp) in a nitrogen atmosphere in an AS-Micro Rapid Thermal Processor. Another PECVD $SiO_2$ layer was then deposited, which resulted in a layer approximately 20 nm thick. The completed dielectric layer is 13 nm $SiO_2$/124 nm spin-on-glass (SOG)/20 nm $SiO_2$. To test the planarization, focused ion beam milling (at 93 pA) was used to mill asymmetric troughs into thermal oxide, and coated the asymmetrically shaped peaks between them with approximately 20 nm of Pt; FIG. 7 shows AFM scans of the surface before and after planarization with SOG. The SOG layer reduces the variation in peak-to-trough height by an order of magnitude.

Etching to Expose the FE Contact Pad

To access the FE contact pad, photolithography was used (as detailed above) to protect all areas aside from the pad using photoresist, hard-baked the resist (after development) for 2 min on a hotplate at 110° C., etched the dielectric layer using a Samco RIE-10NR reactive ion etcher (20 sccm CF4, 3.3 Pa, 50 W, 7 min), and then dissolved the resist in acetone.

Source and Drain Electrodes, Contact Lines and Contact Pad

The photolithography procedure detailed above was used to deposit two 50-nm thick (10 nm Ti/40 nm Ag), 500 μm long contacts, 12 μm apart, as source and drain electrodes to either side of the metal electrode array, in each of the devices (FIG. 6 Panel G). The crosses visible in FIG. 2 Panel A, B and G served as alignment marks.

BHJ Layer

A 1:1 w/w solution of P3HT:PCBM was prepared by weighing 5 mg/mL each (total mass concentration 10 mg/mL), dissolving in o-DCB with 3% 1,8-diiodooctane, and stirring on a hot plate at 80° C. for 30 minutes. The BHJ was deposited by spin coating 0.5 mL (per wafer) for 30 sec at 700 rpm, and then let dry slowly for ~1 min with the spin-coater lid on; we then cleaned the BHJ off of the contact pads using a swab with o-DCB. Alternatively, the BHJ was deposited by drop-casting a 0.25 μL drop and letting it dry in air; this produces a circular film, roughly 2 mm in diameter. Following either method, the wafers were baked on a hot plate at 110° C. for 10 min. The BHJ films are 200-400 nm thick, as measured by profilometry. For the devices discussed in the manuscript, device 1 (and devices D14-19 in general) used a spin-cast film, and device 2 (and devices D20-25 in general) used a drop-cast film.

For some devices, after several months, we dissolved the BHJ layer in toluene, and redeposited the layer by drop casting a lower concentration solution (5 mg/mL). These devices are marked by "2", as in "D21 A2", and were mostly used for the wavelength response measurements shown in FIGS. 3G and 14. Similarly, the 5 mg/mL concentration was used for the series of P3HT:PCBM ratios (100:0, 90:10, 75:25, and 50:50).

Packaging

To protect the active area of each system from air and humidity, a glass cover slip was placed over it, held in place by a drop of silicone vacuum grease. When performing ratcheting measurements, the fabricated devices produce similar results over weeks, with some decrease in the current over months, indicating they only slowly degrade under these conditions.

Example 3

Characterization

Structural Characterization

The fabricated structures were characterized using a Bruker Dimension FastScan atomic force microscope (AFM), and measured the SOG film thickness using a J. A. Woollam M2000U spectroscopic ellipsometer and Filmetrics F20 Thin Film Analyzer reflectometer. The devices were imaged using the electron-beam mode of the FEI Helios Nanolab 600 FIB, and using an optical microscope. A UV/vis absorption spectrum of the BHJ film was recorded using a Varian Cary 5000 spectrometer, at 1 nm resolution and 600 nm/min scan rate, vs. an air baseline, for a BHJ film spin-coated on a glass cover slip.

Electrical Characterization

Electrical connections to the system were made using a Signatone S-1160 probe station, and ratcheting current was measured using a Keithley 6430 Electrometer equipped with a pre-amplifier, and connected to the probe-station with a triax cable. FIG. 5C shows a wiring diagram of the system. The common ground (which is the dark box surrounding the probe station) is usually connected to earth ground, though no difference was observed between having the ground earthed or floating. The FE-common voltage was modulated using a Tektronix AFG3022C function generator (AFG) connected to the probe station with a coaxial cable. The Keithley 6430 and Tektronix AFG3022C instruments were controlled using a custom LabVIEW program. For all of the measurements, the sequence of events was as follows—define the AFG conditions, turn the output on, wait 500 ms, query the Keithley for a current measurement (without sourcing voltage), and repeat. For the Keithley, the 100 nA measurement range was used for all of the measurements, without auto-ranging, as it tended to produce jumps in the current; we also set high-accuracy mode (NPLC 10) and auto-filtering. Some current-voltage scans (but without a flashing potential), testing for electrical shorts between the various components (as in FIG. 9 Panel B) were performed using an Agilent 4155C semiconductor parameter analyzer.

The capacitance and dissipation factor were measured between the drain and finger electrode contact pads, using an Agilent 4285A LCR meter. The devices were treated as capacitors, with the finger electrode array forming the bottom plate, and the organic film with the embedded source and drain electrodes as the top plate. Both the capacitance and dissipation factor vary with the frequency (FIG. 17 Panels A,B), but are largely consistent between the various devices, due to their similar structures.

Illumination

The devices were illuminated for some of the measurements using 4.5 mW laser diodes at 808 nm, 635 nm, and 532 nm (Thorlabs, CPS808S, CPS635, and CPS532, respectively). The spot size of the laser diodes is approximately 0.1 cm2; for an active area of 500×12 μm2, and BHJ film absorbance of 0.2, the light power absorbed by the BHJ film, used for the efficiency calculation, is $P_{light}$=~380 nW.

For some measurements, the devices were illuminated with a Motic MLC-150 fiber illuminator equipped with a 150 W halogen bulb, and 10±2 nm fwhm 1" diameter bandpass filters, with peak transmittance wavelength of 400±2, 450±2, 500±2, 550±2, 600±2, 650±2 and 700±2 nm (Thorlabs FB400-10, FB450-10, FB500-10, FB550-10, FB600-10, FB650-10 and FB700-10). The light was transmitted via a fiber optic light guide (Edmund Optics 39-368, 0.25"×72"), and the guide was fixed about a centimeter away from the wafer. The light intensity was measured at the wafer's position using a Thorlabs PM100D power meter with an S121C sensor (9.5 mm diameter, 0.709 cm2), set to the filter's center wavelength, and adjusted in all cases to 200 uW (0.28 mW/cm2) using the intensity knob on the illuminator.

Example 4

Controls

In the absence of a BHJ layer, the system produces no current (readings below 1 pA), ruling out electrical shorts between the finger electrode array and the source or drain electrodes (FIG. 9 Panel A). Current-voltage scans between the finger electrodes and the drain or source electrodes, or the wafer itself, all show a characteristic capacitor charging/discharging behavior, at extremely low currents (sub-10 pA at 1 V bias), confirming good insulation between the component parts of the system (FIG. 9 Panel B). Devices lacking an FE array, but still containing the FE contact pad and contact lines, were also fabricated; applying the flashing potential in this case produces no current. This control rules out possible wiring or equipment issues producing spurious signals. The insensitivity of the current to the DC offset (FIG. 9 Panel F) rules out any FE-drain/FE-source short as the source of current in the system. Switching the source and drain contacts (connecting the probes designated as source and drain to the drain and source contact pads, respectively), results in measured currents of the same magnitude, and opposite polarity, as expected. Illumination in this state produces the same response equal in magnitude but of the opposite polarity, compared to the regular configuration, as expected. The combination of the above controls, along with the observed photoresponse, demonstrates that the measured current is indeed the result of the finger electrodes ratcheting charges inside the BHJ layer.

The ratchet current measurements for the same device are reproducible across a period of months, though in some cases the current decreases somewhat, which is attributed to the expected degradation of the BHJ film due to oxygen and humidity.

As the source and drain electrodes are of the same material, and thus possess the same work-function, no current is observed when the flashing potential is not applied, save for weak currents (sub 100 pA) in some device under illumination—likely due to a contamination in the source or drain electrode, slightly changing their work-function, and thus creating an asymmetry.

It was found that a single symmetric Au finger electrode (FIG. 6 Panel H), deposited as part of the Au contact line, can produce current, if it is not precisely centered between the source and drain electrodes. Varying the offset of the flashing potential, $V^0$, reveals the difference in behavior—the ratchet devices are largely insensitive to the offset, whereas the single-electrode devices act as charge pumps, and display a double-diode-like behavior (FIG. 9 Panel E), though somewhat offset from the origin, that is, they produce non-zero short circuit current.

Capacitive Influence of the Wafer

The substrates used are p-type (B-doped) conductive Si wafers, though they are not used electrically in this system. During our measurements, the wafer sits on a metal stage, which is electrically insulated from the rest of the system. To test for possible effects, some measurements were repeated while electrically grounding the wafer (via the stage, the thermal oxide layer on the back of the wafer was etched); and while applying a static +5 or −5 V potential to the wafer. Neither intervention produced any measurable difference in our results.

Capacitively Coupled Current

One concern when measuring a DC current in a system with an AC component, is the possibility of a capacitively coupled current being rectified by the current measuring device, the ammeter. When an AC field is applied to the finger electrodes (FE), it induces a temporary charge in the BHJ layer directly above the FE array; the induced localized charge will alternate between positive and negative, with the same frequency as the applied field. This localized charge is formed by charge carriers flowing to the BHJ layer above the FE array from (i) other areas of the BHJ film (as the drop-cast film is much larger than the active area itself), thus polarizing the film; (ii) the ground, via the drain electrode; and (iii) the ground, via the source electrode. As the ammeter measures the current between the ground and the source electrodes, some electrons will flow through inadvertently rectified by the ammeter, which will then report a DC current, with no actual ratcheting taking place in the BHJ layer.

Experiments conducted during development of embodiments herein demonstrate that ratcheting, and not an artifactual capacitively-coupled current, is observed, for at least the following reasons:

(1) Placing the ammeter between the source and ground, or the drain and ground, produces equal magnitude and opposite signs of the DC current. This indicates that the measured current is a real DC current, flowing from the ground, via one electrode, through the transport layer, and through the other electrode back to ground. If the measured current was a rectified capacitively-coupled current, its sign would not change upon switching the ammeter between source and drain, as the AC frequency is the same. There would, also, be no reason for equal magnitudes of current from those two electrodes.

(2) No DC current is measured if the drain is not grounded. A capacitively-coupled current flows between the source and the transport layer, to balance the potential applied to the FEs. In this scenario, the drain electrode is not required. That the drain electrode must be grounded indicates that charges must flow through both source and drain electrode to produce a current, meaning a charge is flowing through the transport layer.

(3) Several control devices have been fabricated, which are identical to the active devices in all aspects except that they lack a finger electrode array. These devices still possess a finger electrode contact pad, and a contact line leading from it to the active array; thus, a capacitor is still formed between the FE contact line and the S-BHJ-D top layer. The BHJ film is much larger than the active area, and so the FE contact line significantly overlaps the BHJ film. No current peaks were measured for these devices; they have ~20 pA currents that do not depend on frequency (FIG. 10 Panels A,B).

Figure 10:
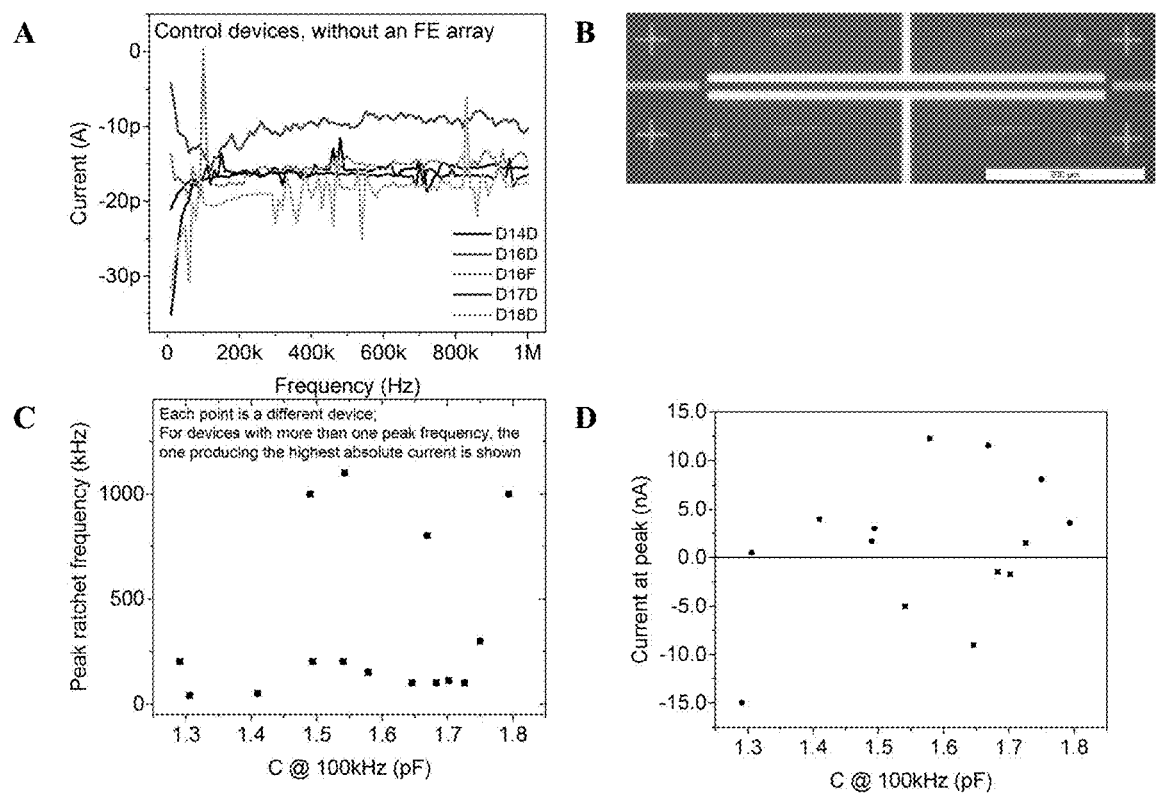
FIG. 10. (Panel A) Current vs. flashing frequency in the dark, A=10 V, for five control devices, identical to regular device except lacking an FE array (the devices still have an FE contact pad and contact line). (Panel B) An optical microscopy image of one such control device, prior to BHJ deposition. Note the FE contact line leading off the right edge of the image. (Panel C) The flashing frequency producing peak current (at zero source-drain bias) vs. the capacitance between the FE and source (FIG. 17 Panel A) at 100 kHz, for all of the devices studied. Some devices display more than one current peak, sometimes at different polarities; here, the frequency producing the largest current magnitude was selected.

(4) If the measured current were the result of a capacitively-coupled current being rectified in the Keithley, the capacitance would be expected to correlate with the peak ratcheting frequency; this is not case, as shown in FIG. 10 Panel C.

(5) The identity (e.g., shape) of the finger electrode is important—if the asymmetric finger electrode array is replaced with a single, flat, gold electrode (FIG. 6 Panel H), the behavior of the device changes; current is still measured, because the flat electrode is not precisely centered between the source and drain electrodes—this effect has been reproduced in simulations. However, when the DC offset $V_0$ is varied, the difference between a ratchet with a finger electrode array and a pump, where the flat electrode acts as a single asymmetric unit is apparent (FIG. 9 Panel E). The devices with the finger electrode array are largely insensitive to the offset voltage, whereas this single-electrode device displays a double-diode-like behavior, with non-zero short circuit current. Were the measured current simply a rectified capacitively-coupled current, the identity of the FE would not matter—their function would simply be to charge the BHJ layer, and so any conductive electrode would be equivalent. The fact that a flat plate displays such different behavior from the shaped FE array shows that the FE's function extends far beyond simply charging or polarizing the BHJ layer.

Different P3HT:PCBM Blend Ratios

Figure 16:
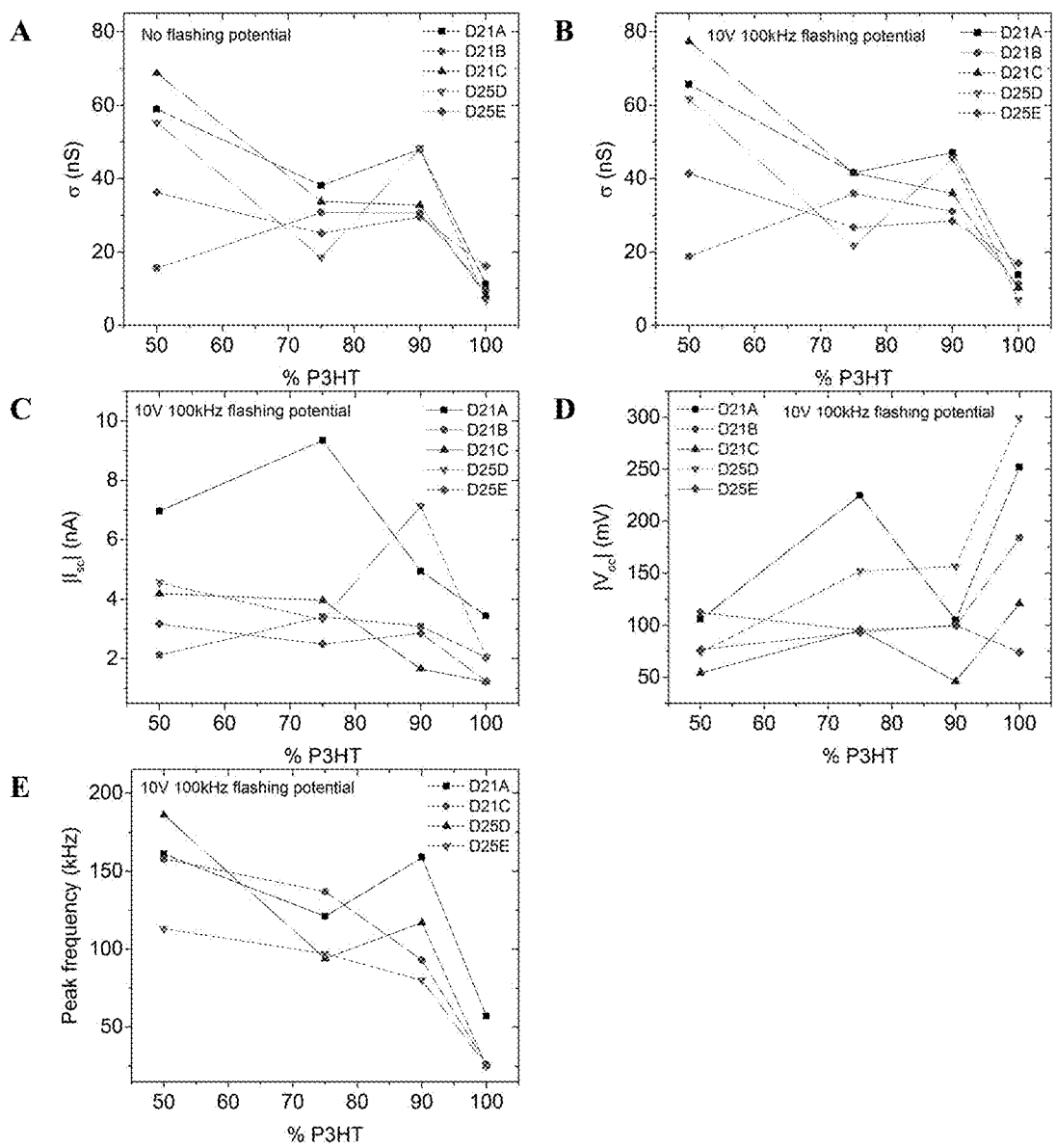
FIG. 16. The electric and ratcheting properties of five devices, coated with four different P3HT:PCBM blend ratios. (Panel A) Conductivity without an applied flashing potential. (Panel B) Conductivity, (Panel C) short-circuit current magnitude and (Panel D) open-circuit voltage magnitude for an applied potential of f=100 kHz, A=10 V. The conductivity (σ), short-circuit current ($I_{SC}$) and open-circuit voltage ($V_{OC}$) were obtained from a linear fit to a current-voltage plot (−0.3-0.3 V). (Panel E) The flashing frequency producing the maximum $I_{SC}$; the frequency response of device D21 B exhibits very wide, flat peaks, so no peak frequency could be determined.

On five of the devices, P3HT:PCBM blends were deposited in four different w/w ratios –50:50 (the standard ratio used for measurements in the experiments conducted during development of embodiments herein), 75:25, 90:10 and 100:0 (pure P3HT), and the electrical and ratcheting characteristics were measured (FIG. 16). PCBM enriched blends (e.g., 25:75 P3HT:PCBM) produced non-conductive films at low (sub 1 V) biases, due to the contact barrier between PCBM and the Ag source and drain electrodes. In general, the conductivity, short-circuit current, and peak ratcheting frequency (the oscillation frequency producing the highest current) all decrease with increasing P3HT content, though the relationship is not necessarily monotonic. Gradual changes in the ratchet characteristics with gradual changes in the composition of the blend (for all five devices we tested) demonstrate that the current is due to ratcheting, and not an artifact specific to, for example, electrode configuration.

Temporal Driving

The measured current is largely insensitive to variations of the DC offset, $V_0$ (FIG. 9F). When $V_0=\pm A$, the temporal driving is equivalent to $a\pm\sin^2(t)$ function (of f/2 frequency), a common type of on/off driving. Though a sin(t) temporal dependence is uncommon, it has been predicted to produce ratcheting for an asymmetric spatial potential in a dissipative system, and this was shown in at least one experiment.

Peak Ratcheting Frequency

The applied potential generates fields of about $$\frac{0.5 \text{ V}}{400 \text{ nm}} = 12.5 \frac{\text{kV}}{\text{cm}}$$

Figure 11:
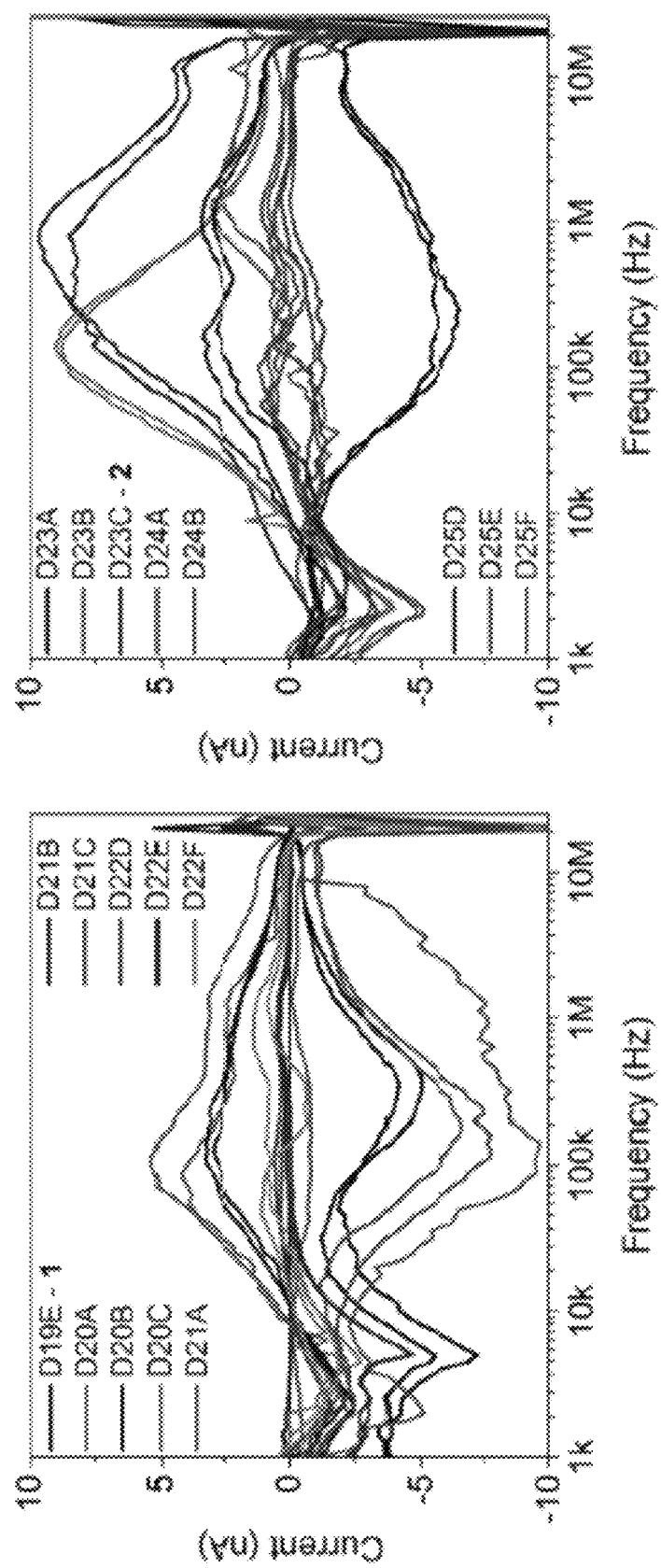
FIG. 11. Bi-directional sweep of $I_{SC}$ vs. flashing frequency in the dark, A=10 V, for 18 devices, including devices 1 and 2 (indicated).

(FIG. 2 Panel D); assuming a mobility $$\mu = 0.005 \frac{\text{cm}^2}{\text{V} \cdot \text{s}},$$

a reasonable figure for this type of BHJ, a charge accelerated by the field would need $$\frac{\Delta x}{\mu E} = \frac{800 \text{ nm}}{0.005 \frac{\text{cm}^2}{\text{V} \cdot \text{s}} \cdot 1.25 \frac{\text{kV}}{\text{cm}}} = 1.28 \text{ }\mu\text{s}$$

to travel 800 nm (the periodicity), which corresponds to f=781 kHz, on the same order as the peak frequencies we observe. This rough calculation unrealistically simplifies the situation to a static field, uniform over the course and duration of the charge's trajectory, but this approximation is sufficient for such order-of-magnitude discussions. For all of the devices studied, the strongest currents are observed for flashing frequencies in the region of 100 kHz to 1 MHz (FIG. 11).

Energy Efficiency

The energy efficiency varies between the devices, Table 1. For D24 A, illumination decreases the ratcheting current, so the peak efficiency is achieved in the dark, $P_{out}=0.11$ V·6.68 nA=0.735 nW. For D24 A, at 100 kHz, C=1.579 pF and DF=0.302%. For A=10 V and f=100 kHz, $P_{loss}=V_{rms}^2 \cdot 2\pi f \cdot C \cdot DF=150$ nW. The power conversion efficiency is then $$\eta = \frac{P_{out}}{P_{loss}} = 0.49\%.$$

TABLE 1

Efficiency of various devices at the indicated frequency, calculated using the measured capacitance and dissipation factor, the contribution of light, and the measured output power.

| | $f$ [kHz] | C [pF] | DF [%] | $P_{loss}{}^a$ [nW] | Light | $P_{light}$ [nW] | $P_{in}{}^b$ [nW] | $P_{out}{}^c$ [pW] | $\eta^d$ [%] |
|---|---|---|---|---|---|---|---|---|---|
| D19E | 500 | 1.3* | 0.25* | 510 | Dark | 0 | 510 | 83 | 0.016 |
| D19E | 500 | 1.3* | 0.25* | 510 | 532 nm | 380 | 890 | 640 | 0.072 |
| D21A | 100 | 1.3* | 0.25* | 102 | Dark | 0 | 102 | 213 | 0.209 |
| D21B | 100 | 1.3* | 0.25* | 102 | Dark | 0 | 102 | 61 | 0.06 |
| D21C | 100 | 1.3* | 0.25* | 102 | Dark | 0 | 102 | 121 | 0.119 |
| D22F | 1000 | 1.218 | 0.12 | 459 | Dark | 0 | 459 | 144 | 0.031 |
| D23C | 200 | 1.466 | 0.275 | 253 | Dark | 0 | 253 | 234 | 0.092 |
| D24A | 100 | 1.579 | 0.302 | 150 | Dark | 0 | 150 | 735 | 0.491 |
| D25D | 1000 | 1.287 | 0.163 | 659 | Dark | 0 | 659 | 172 | 0.026 |
| D25E | 1000 | 1.26 | 0.143 | 566 | Dark | 0 | 566 | 113 | 0.02 |
| E25F | 100 | 1.702 | 0.27 | 144 | Dark | 0 | 144 | 10 | 0.007 |

$^a$Calculated using $P_{loss} = V_{rms}^2 \cdot 2\pi f \cdot C \cdot DF$
$^b P_{in} = P_{light} + P_{loss}$
$^c$The maximum work done against a bias, as measured in an IV sweep at the indicated flashing frequency, and at a potential amplitude A = 10 V.
$^d \eta = \dfrac{P_{out}}{P_{in}}$
*typical values, as no C or DF values were measured for these devices The energy efficiency is increased by reducing the area of the BHJ film. The BHJ solution is drop-cast on the active area, and the resulting film is approximately circular, 2 mm in diameter. The active area itself is only 500×12 μm2. Overlap between the FE contact lines and FE2 contact pad (see FIG. 5A), and the BHJ film above, needlessly increases the capacitance, by increasing the area of the capacitor (FIG. 17 Panel C). Were the BHJ film deposited solely on the active areas, the capacitance, and consequently the power loss, would be far lower, and thus the efficiency would be higher. The current size of the BHJ film is a result of the method of fabrication, and not a requirement for the ratchet to operate, and so a more selective deposition could result in a large efficiency improvement. For the device shown in FIG. 17 gold electrode Panel C, the vast majority of the capacitor area results from this extraneous overlap, rather than over the FE array—
A(FE array)=500 μm×6.8 μm=3,400 μm$^2$; A(FE2 pad)=200 μm×200 μm=40,000 μm$^2$;
A(contact lines)=10 μm×(300+750+1750) μm=28,000 μm$^2$;
A(total)=71,400 μm$^2$. Careful deposition of the BHJ only over the active area could then reduce the area of the capacitor, the capacitance, and thus the power loss, by a factor of (71,400/3,400=) 21.

Current Vs. Illumination Intensity

Figure 15:
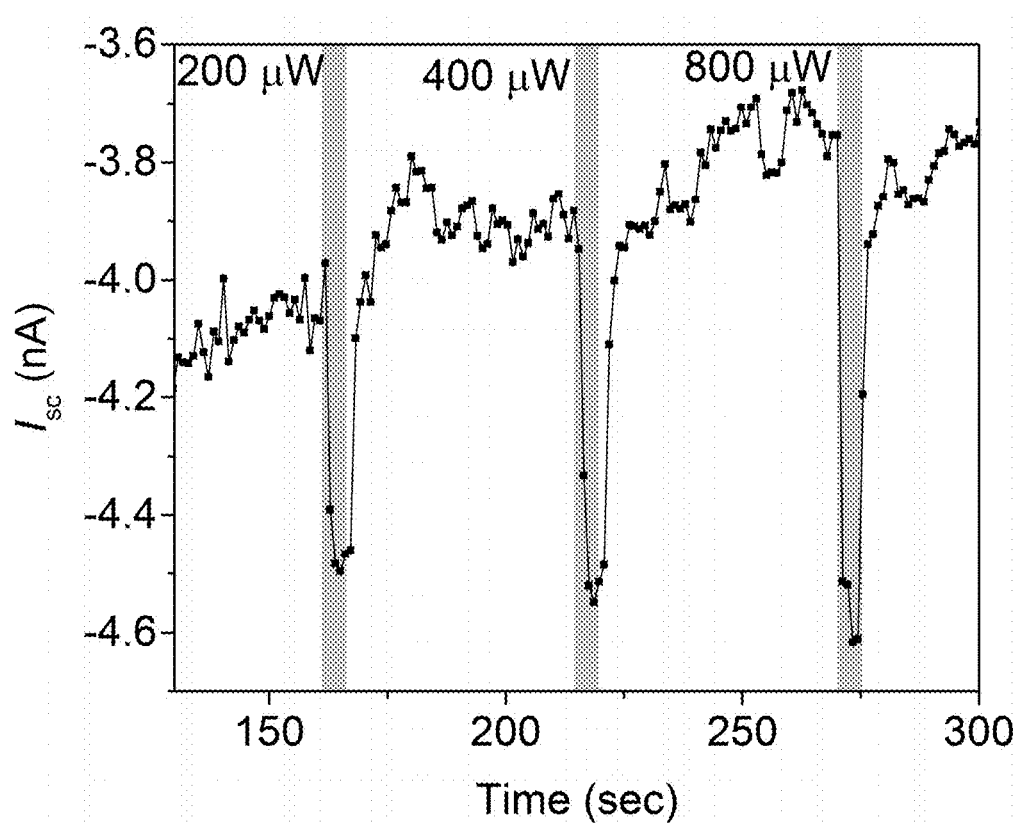

To measure the response of the ratcheting current to illumination at different intensities, the current was continuously measured while applying a flashing potential at one set of conditions (frequency, amplitude and offset), while the device was not illuminated. Then the power of the laser was adjusted (by rotating a smoothly-varying neutral-density filter wheel, and measuring the power using a Thorlabs PM100D power meter with an S121C sensor), and the device was exposed to the laser light for about 5 seconds. Such short exposures minimize the slower reversible and irreversible changes in ratcheting current in response to illumination, which we have observed (see below). The measured current in the illuminated state was compared with the current in the dark state, immediately prior to the start of illumination (FIG. 15). This method also negates the effects of a slowly varying baseline (dark) current. The illumination power density in mW/cm$^2$ was calculated by dividing the measured power by the spot size, projected on the device at an angle, which is about 0.1 cm$^2$.

Long-duration illumination

Figure 19:
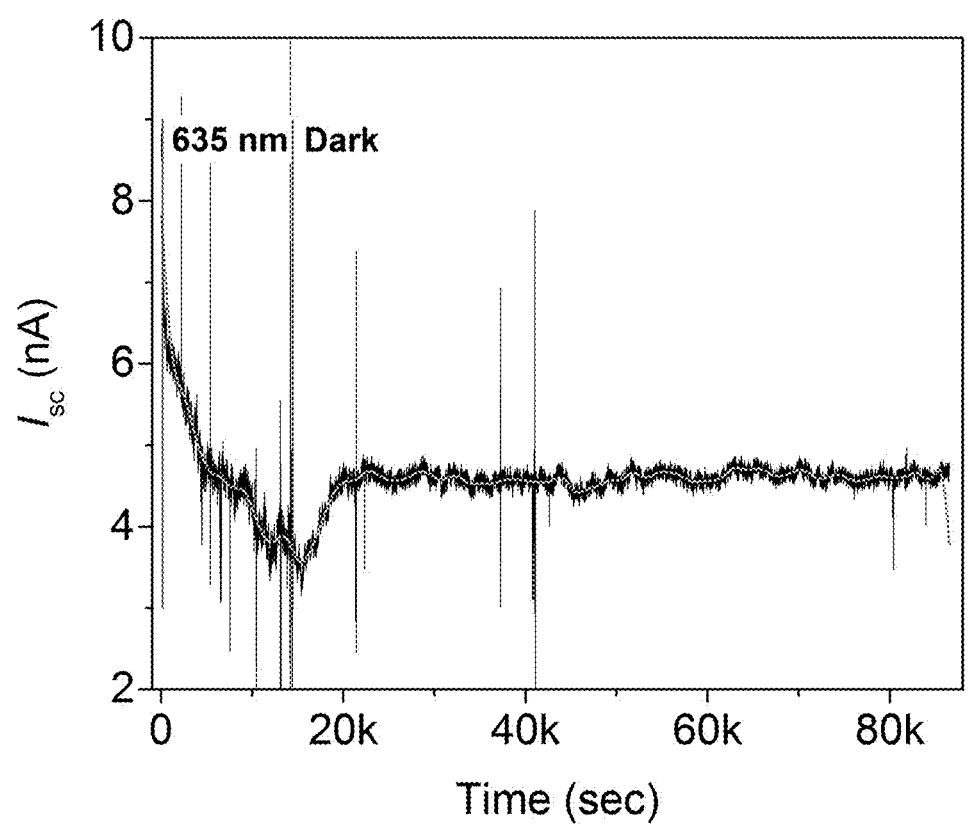
FIG. 19. Measured current vs. time (sec), for one exemplary device, under illumination at 635 nm, and in the dark (indicated); f=100 kHz, A=10 V.

The ratcheting current tends to decrease in magnitude when illuminated for a long duration (tens of minutes), and slowly and partially recovers once in the dark again (FIG. 19). Thus, illumination produces reversible and irreversible (or slowly-reversible, over the course of hours or days) changes in the material, possibly related, respectively, to charging and to a photo-catalyzed oxidation, as the device isn't fully protected from ambient air. The conductivity across the BHJ layer, however, is only minimally affected, if at all. While a conductivity measurement utilizes the path of least resistance, the ratcheting process might depend on the overall morphology of the film, explaining the discrepancy. Illumination with a 4.5 mW laser at 405 nm produced an irreversible change within minutes, actually changing the direction of ratcheting current in one device; this laser was not used further in this study.

Example 5

Current Maximization

Methods

Exemplary Device Fabrication. Photolithography was used to deposit 10 nm Ti/40 nm Au contact pads and lines for the finger electrodes (FEs), on p-type B-doped Si wafers, 300 μm thick, with 1000 nm thermal oxide. Focused ion beam (FIB) was used to deposit eight Pt FEs, 600 μm long, 400 nm wide, 400 nm apart, and about 50 nm thick, with an asymmetric thickness profile. The FEs overlap, at their ends, with the previously deposited contact lines. Devices were coated with a sandwich structure of 13 nm plasma-enhanced chemical vapor deposition (PECVD) SiO$_2$/140 nm spin-on-glass/20 nm PECVD SiO$_2$. This structure provides a relatively flat, planar top surface. Photolithography and reactive ion etching (RIE) were used to etch the oxide layer over the FE contact pad. Photolithography was then used to deposit 10 nm Ti/40 nm Ag source and drain electrodes, contact lines and contact pads; the electrodes are 500 μm long, 10 μm wide, and 12 μm apart, with the FE array in the middle (under the dielectric layer). Therefore, the channel width is 500 μm, and the length is 12 μm. Drop casting is used to deposit a P3HT:PCBM blend or pure P3HT, from o-DCB (5-10 mg/mL, with 3% v/v 1,8-diiodooctane) on the active area, and thermally anneal at 110° C. for 10 min. This blend was used to facilitate comparison with previous work; because of its importance in organic electronics field; because it allows tuning of the conductivity over an order of magnitude by varying the ratios of its constituents; and because it allows demonstration of the generality of observations for both a blend and a monolithic material.

Use of Ag source and drain electrodes creates a significant contact barrier for electrons at the PCBM-Ag junction, meaning that, even in P3HT:PCBM blends, charge carriers can only complete a circuit through the P3HT component, which is primarily a hole carrier.

Ratcheting Measurements. A temporally modulated potential was applied to the finger electrodes using a Tektronix AFG3022C arbitrary waveform generator, and the current was measured using a Keithley 6430 sub-femtoamp remote source-meter unit (SMU) or a Keysight B2900A series SMU, all controlled using a custom LabVIEW program. Electrical contacts were made using a Signatone S-1160 probe station kept inside a metal dark box, on an active vibration isolation table, in room-temperature in air.

Results

Experiments were conducted during development of embodiments herein to optimize the ratcheting of electrons in an organic semiconductor by tuning the temporal modulation of the oscillating potential, applied using nanostructured electrodes. An analytical model of steady-state carrier dynamics was used to determine that symmetry-breaking motion of carriers through the thickness of the polymer layer enables even temporally unbiased waveforms (e.g., sine) to produce current, an advance that provides the use of electromagnetic radiation to power ratchets. The analysis maps the optimal operating frequency of the ratchet to the mobility of the transport layer and the spatial periodicity of the potential; and relates the dependence on the temporal waveform to the dielectric characteristics and thickness of the layer.

Ratcheting is a means for transporting particles in systems where long-range gradients are ineffective due to strong thermal noise and damping of particle motion by the environment (Refs. B1, B2; herein incorporated by reference in their entireties). Biological systems commonly rely on ratchets to produce motion in the highly-damped environment of the cell, providing energy in the form of ATP, and breaking the symmetry using asymmetric protein structures, which bias conformational changes in response to stimuli such as the binding of small molecules (Ref. B 1; herein incorporated by reference in its entirety). For example, myosin travels along actin fibers to transport cargo or contract muscles. It experiences a multistep cycle of binding to the actin fiber, multiple conformational changes, and dissociation from the fiber, gated by the binding and consumption of ATP (Ref 3; herein incorporated by reference in its entirety. The time-dependence of the energy input is also a source of asymmetry—the binding and release events of ATP, are timed to be optimally coupled to the natural Brownian motion of the myosin head, to allow the complex to transduce the elastic energy of its stretched conformation to irreversible translation of the actin fiber, with high efficiency.

Provided herein is the application of the ratchet mechanism in a highly-damped electronic system; a low-mobility organic semiconductor introduces new modes of charge transport to these systems that are not inhibited by (and in some embodiments exploit) their inherent energetic disorder. Low charge transport efficiency, leading to space-charge formation and carrier recombination, is a reason for poor performance of organic electronic devices, such as organic photovoltaics (Refs. B4, B5; herein incorporated by reference in their entireties). In existing devices, charge transport relies on device-scale gradients in chemical potential and work function that are disrupted by energetic disorder and scattering of the electron from defects and vibrations.

To rectify non-directional sources of energy to produce particle motion without a static bias, a ratchet system is driven away from equilibrium by the input of energy, and its inversion symmetry along the direction of transport is broken (Refs. B8-B10; herein incorporated by reference in their entireties). In synthetic ratchets that transport charged particles, whether classical particles or electrons, energy is commonly supplied to the system using oscillating electric fields (Refs. B7, B11-B15; herein incorporated by reference in their entireties). For a "multiplicative flashing ratchet", the shaped field is the product of a temporal modulation, g(t), and a periodic spatial function, U(r), composed of asymmetric repeat units:

$$V(r,t)=g(t)\cdot U(r).$$

U(r) provides the structural asymmetry required for ratcheting. In most previous work, the temporal driving function g(t) is also a source of asymmetry. It oscillates between 'on' and 'off' states, either as a square wave or as $\sin^2(t)$ (Refs. B7, B9, B12-B16; herein incorporated by reference in their entireties). In the 'on' state, particles localize in asymmetric potential wells, and in the 'off' state they diffuse isotropically (Ref. B17; herein incorporated by reference in its entirety). The potential, when turned on again, causes particles to relax asymmetrically, due to the different distances between the well and the potential barriers to its immediate left and right, producing transport (Ref. B9; herein incorporated by reference in its entirety). As diffusion is typically slower than localization, transport is limited by the motion of the particles in the 'off' state. If the 'off' state is too short, particles lack the time to diffuse toward the next well, and no transport is possible; if it is too long, the particles diffuse across many periods of the potential, and the asymmetry becomes irrelevant. The duration of the 'off' state should therefore be comparable with the diffusion rate of the particles, and so a resonance condition for ratchet operation emerges (Ref. B18; herein incorporated by reference in its entirety).

The transport of overdamped classical particles within a 1D flashing ratchet could be improved by using a positive-negative drive (oscillating between equal-magnitude positive and negative potentials), rather than an on/off drive, thanks to the elimination of the rate-limiting diffusive step (Ref. B19; herein incorporated by reference in its entirety). To produce any current in the 1D system, however, the durations of the positive and negative states of the potential must be unequal (i.e., the temporal drive must be biased), as the positive and negative states exactly mirror the asymmetry of the potential, and produce motion in opposite directions, nullifying one-another's effects. In contrast, unbiased sine and square wave drives, oscillating between equal-magnitude positive and negative states for equal durations, do produce current in a flashing electron ratchet with an organic semiconductor, a blend of poly(3-hexyl-thiophene-2,5-diyl) (P3HT) and [6,6]-phenyl-$C_{61}$-butyric acid methyl ester (PCBM), as the charge transport layer (Ref. B6; herein incorporated by reference in its entirety). This result indicates (i) the presence of a symmetry-breaking mechanism in 3D systems not available in the 1D models, and (ii) the production of current through rectification of an AC field with an unbiased waveform enables the future use of sine wave sources, e.g., electromagnetic radiation, to power ratchets, a very impactful advance for their application in passive (e.g., logic) and active (e.g., energy conversion) devices.

Experiments were conducted during development of embodiments herein to analyze the response of an experimental system to a wide range of biased and unbiased waveforms, and, with the help of an analytical model of a deterministic classical ratchet (Ref. B21; herein incorporated by reference in its entirety), relate the observations to the physical properties of the device. These experiments explain the mechanism that allows the electron ratchet to produce current with an unbiased temporal drive, and identify the factors that determine the optimal temporal modulation of the applied ratchet potential.

Figure 20:
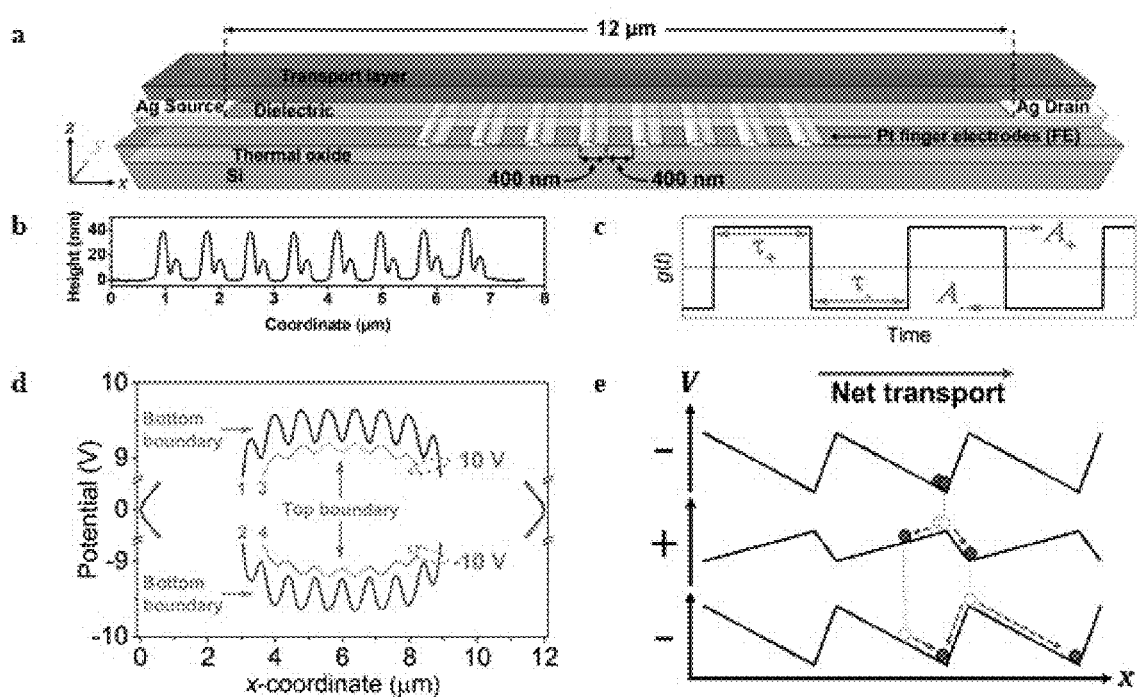
FIG. 20. Experimental device, driving, and ratcheting mechanism. (Panel a) Diagram of the experimental system. (Panel b) Atomic force microscopy line-scan of the asymmetric finger electrodes in one device, D21 A. (Panel c) Temporal square driving function, with the durations (τ) and magnitudes (A) of the '+' and '−' polarities indicated. (Panel d) Simulated electric potential at the bottom (traces 1,2) and top (traces 3,4) boundaries of a 200-nm thick transport layer for two applied potentials (±10 V). Holes (the majority carriers) alternating between the bottom and top boundaries for negative and positive applied potentials, respectively, primarily experience the potentials shown by traces 2 and 3. (Panel e) Two-state potential model: holes switch between two potentials of opposite signs and unequal amplitudes. Net transport to the right is achieved because the shallower slopes in the '+' state (repulsive, when the holes at the top boundary) do not provide enough force for holes tending to the left to reach the next potential well once the potential switches polarity, but do provide enough force for the holes to travel the shorter distance required to relax to the next well to the right.

System design. FIG. 20 Panel a is a schematic diagram of an electron ratchet device, which is fabricated on an Si wafer with a thermal oxide layer. The potential is applied by an array of eight 400 nm wide Pt finger electrodes (FEs) with an asymmetric thickness profile, encased in a dielectric layer. Carriers travel in the drop-cast transport layer (100-400 nm thick) between Ag source and drain electrodes, 12 μm apart. The spatial potential experienced by the electrons within the transport layer, U(r), is determined by the shape of the asymmetric FEs in each device, e.g., FIG. 20 Panel b, and the dielectric response of the layer. An unbiased drive—specifically, a sine wave drive—produces current at zero applied source-drain bias (short-circuit current, $I_{sc}$, herein "ratchet current"), in a series of devices like that pictured in FIG. 20 Panel a with a variety of FE shapes. Here, the ratchet is driven with a square wave, with temporal component g(t) (FIG. 20 Panel c), to allow systematic investigation:

$$g(t) = \begin{cases} A \text{ for } n\tau \leq t < n\tau + \tau_+ \\ -A \text{ for } n\tau + \tau_+ \leq t < (n+1)\tau \end{cases} n \in \mathbb{Z}.$$

The response of the measured ratchet current to variations in the amplitude (A) and the $$\text{duty ratio} = \frac{\tau_+}{\tau},$$

where $$\tau = \tau_+ + \tau_- = \frac{1}{f}$$

is the temporal period of the oscillation. An unbiased square wave has duty ratio=0.5. FIG. 20 Panel d shows the simulated electrical potential at the bottom and top boundaries of the transport layer for different applied voltages, for an array of asymmetric FEs. The potential is applied using FEs under the transport layer, so it decays with distance from the bottom to the top of the layer.

Figure 21:
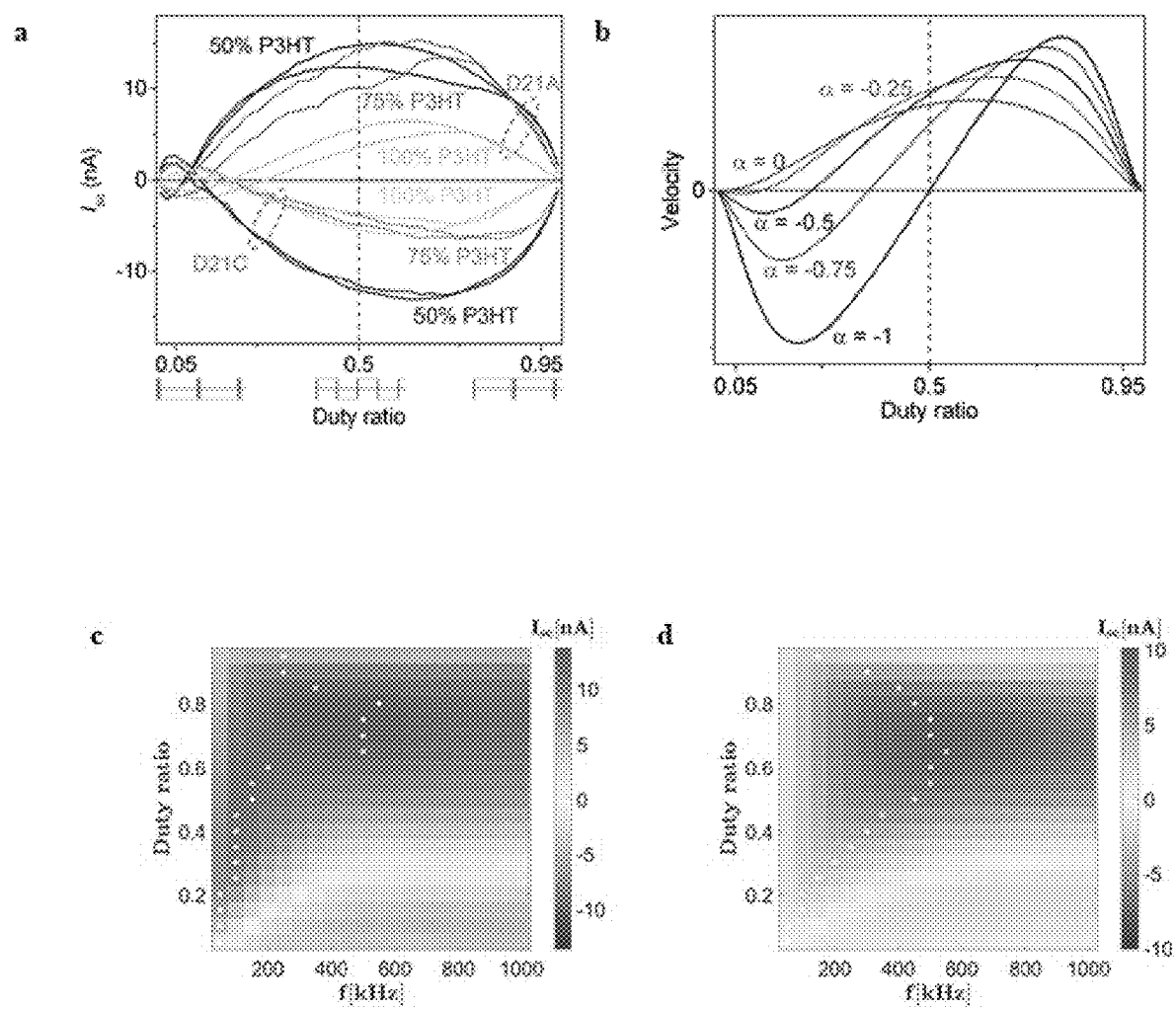
FIG. 21. Tuning the temporal drive to modulate the current. (Panel a) $I_{sc}$ vs. the duty ratio of a square waveform, for two devices coated with films of different P3HT content (indicated; PCBM makes up the remainder), f=100 kHz, A=10 V; the shapes of the temporal waveforms for 0.05, 0.5 and 0.95 duty ratio are drawn; the traces are bidirectional sweeps, starting from a 0.01 duty ratio. (Panel b) Calculated velocity (unitless) vs. duty ratio for different a values (indicated), modeled using an analytical solution for a two-state potential model. (Panel c) $I_{sc}$ vs. the flashing frequency and duty ratio for device D21 A with a 50% P3HT film, A=10 V. (vd) Calculated $I_{sc}$ vs. the flashing frequency and duty ratio, with σ=500 μm·50 nm, L=800 nm, T=293 K, $\alpha_1$=0.25 V·q, $\alpha_2$=0.05 V·q, $n_e$=10$^{15}$ cm$^{-3}$, and D is normally distributed with a mean at 2.5×10$^{-4}$ cm² s$^{-1}$ and a standard deviation of 2×10$^{-4}$ cm² s$^{-1}$. In panels c and d, the frequency maximizing the (positive) current for each duty ratio is marked with a dot.

Impact of temporal modulation. FIG. 21 Panel a shows the ratchet current ($I_{sc}$) for two devices with two different potential shapes (devices D21A and D21C, FIG. 20b and FIG. 25 Panel a) as a function of the duty ratio, with f=100 kHz. On each of the two devices, three different compositions of P3HT-PCBM films, 50%, 75%, or 100% w/w P3HT, are separately deposited. One device produces positive ratchet current and the other, negative. These experiments focused on the fact that, although the direction of current is different for the two devices, they produce a similar response of $|I_{sc}|$ to the temporal symmetry of the driving potential (given by the duty ratio) for all three compositions. Specifically, there is a weak initial current peak around a 0.05 duty ratio, followed by a current reversal around 0.1, after which the current grows in intensity until it saturates around 0.5-0.7 (the exact range varies between devices), and finally decays toward zero as the duty ratio approaches 0.99. Ratcheting is based on switching the ratcheted particles between two (or more) energy surfaces and allowing them time enough to explore both surfaces. At extremely low or high duty ratios, the carriers lack the time to explore one of the surfaces, and are effectively trapped in a single, constant energy surface. The non-zero $I_{sc}$ at a 0.5 duty ratio means that these ratchets work with an unbiased temporal drive. The appearance of the small peak at ~0.05 duty ratio and the current reversal are explained below.

Mechanism of symmetry breaking and analytical model. Theoretical work (Ref. B19; herein incorporated by reference in its entirety) for a 1D continuously driven ratchet predicts the current will be zero at a 0.5 duty ratio and will be perfectly antisymmetric about the 0.5 duty ratio line. The experimental results herein (FIG. 21 Panel a) show no such antisymmetry and devices produce substantive current even for the unbiased, 0.5-duty ratio, case. Experimental system electrons are free to move in a 3D layer, with a thickness of hundreds of nanometers. The potential, applied by FEs under the transport layer, alternately attracts the carriers toward the bottom boundary of the transport layer and repels them toward the top boundary. The potential decays in magnitude and becomes more symmetric with greater distance from the FEs, FIG. 20 Panel d; the carriers therefore experience a stronger, more asymmetric attractive potential (when they are close to the FEs), than a repulsive potential (when they are far from the FEs). In essence, due to this decay of the field, though the applied potential g(t) oscillates between A and −A (where we set A<0 to be attractive for the majority carriers, holes), the effective potential experienced by the carriers, $g_{eff}(t)$ oscillates between A and αA, where $-1<\alpha \leq 0$. Experiments conducted during development of embodiments herein indicate that it is this symmetry-breaking motion in the z-direction that allows our ratchet to produce a current even when driven by an unbiased temporal waveform.

Experiments were conducted during development of embodiments herein to determine whether symmetry-breaking motion in the z-direction within a 3D ratchet can substitute for biased temporal driving in a 1D ratchet, the 3D system is described with a 1D analytical model for particles subject to a potential oscillating between two states of opposite sign but unequal amplitude, for various durations, FIG. 20 Panel e. This model is based on a high-temperature expansion equation for non-interacting particles in time-dependent, spatially periodic potentials (Ref. B21; herein incorporated by reference in its entirety). To apply this 1D model to the 3D system, two assertions are made: (i) since the 3D device is uniform in they-direction (see FIG. 20 Panel a), motion in this direction is neglected as a source of ratcheting, and a 2D problem remains in the x-z plane; (ii) the fraction of time the particles spend moving in the z-direction is negligible relative to their motion in the x-direction, allowing the device to be treated as a 1D system. Assertion (ii) is supported by the different scales of potential gradients within the transport layer (FIG. 20 Panel d): the carriers are accelerated between the boundaries when the applied potential reverses polarity, a change of 20 V, leading to a very fast transition between the top and bottom of the layer. At and near the boundaries, however, the carriers travel along the weaker gradients of the potential in the x-direction (~0.25-0.5 V over 400 nm), a much slower process. These relatively fast and slow motions have been observed in simulations of classical charged particles in a 2D system, of a similar geometry to the electron ratchets herein (Ref. B22; herein incorporated by reference in its entirety).

Within the model, the spatial ratchet potential was approximated as a biharmonic function, q is the elementary charge, $\alpha_{1,2}$ are potential energies, and L is the periodicity:

$$qV(x) = a_1 \sin\left(\frac{2\pi x}{L}\right) + a_2 \sin\left(\frac{4\pi x}{L}\right).$$

The particles' average velocity is given by (Ref. B23; herein incorporated by reference in its entirety):

$$v = \frac{\pi}{4}\frac{D}{L}\beta^3 a_1^2 a_2(1-\alpha)^2[(1+\alpha)\Phi_1(\xi,\delta) + (1-\alpha)\Phi_2(\xi,\delta)].$$

D is the diffusion coefficient of the charge carriers in the selected transport material, $\beta \equiv (k_B T)^{-1}$, where $k_B$ is Boltzmann's constant and T is the temperature, and a is the amplitude of the potential at the repulsive state (the top boundary of the transport layer), $-1 \leq \alpha \leq 0$. The temporal modulation, a therefore switches the potential between $A_+ = 1$ and $A_- = \alpha$, FIG. 20 Panel c. $\Phi_{1,2}$ are functions of the dimensionless parameter $$\xi \equiv \left(\frac{L}{2\pi}\right)^2/D\tau$$

and of $\delta \equiv \tau_-/\tau$, and are detailed in the Supporting Information. The ratchet current $I_{sc}$ is obtained by:

$$I_{sc} = v n_e A q \quad (5)$$

where $n_e$ is the carrier density and a is the cross-sectional area of the source/drain electrodes.

This model focuses on the response of the ratchet current to the temporal form of the driving potential, and only accounts for the overall direction of asymmetry of the potential, rather than the detailed shape of it. The model is sufficient, however, to track the dependence of the ratchet current $I_{sc}$ on two main temporal parameters of the applied ratchet potential, (i) the duty ratio $$\frac{\tau_+}{\tau}$$

and (ii) the oscillation frequency $f=1/\tau$, and on two fixed parameters characteristic of the device and the transport layer, (i) the degree to which the applied field decays through the thickness of the transport layer, $\alpha$ (dictated by the dielectric response of the material) and (ii) the diffusion coefficient of the hole through the transport layer, D (dictated by the material's hole mobility). All four of these parameters are controllable through design of the device and its driving field, and the application of this simple 1D model suggests strategies for tuning them to optimize ratchet performance.

Asymmetry is provided by motion of carriers in the z-direction. FIG. 21 Panel b shows the calculated unitless velocity of the holes as a function of duty ratio using the 1D analytical model for different a values, setting $\xi=0.162$ (a typical value for the experimental devices and operating frequencies). When $\alpha=-1$, implying a uniform, non-decaying field in the z-direction, the current is anti-symmetric about the 0.5 duty ratio line—it reverses direction at a duty ratio of 0.5. As the value of $\alpha$ approaches 0, implying strong decay of the field in the z-direction, the anti-symmetry of the response around a 0.5 duty ratio is lost, the duty ratio at which the current reverses direction decreases because longer durations in the negative state are needed to compensate for its lower magnitude, and the simulated data increasingly resembles the experimental data for device D21 A in FIG. 21 Panel a. For any $\alpha \neq -1$, the holes oscillate between two potentials of unequal magnitudes, and the ratchet can produce transport even if the potentials are applied for equal durations (0.5 duty ratio). A value of $\alpha=-0.5$ in the model, where the magnitude of the (repulsive) potential felt by the holes at the top boundary is 50% that of the (attractive) potential felt by the holes at the bottom boundary, approximately reproduces the shapes of the experimental current vs. duty ratio curves of FIG. 21 Panel a. This result is reasonable, since the gradients of the applied potential in the x-direction in the devices decay by about a factor of two at the top boundary, FIG. 20 Panel d. The small peak around 0.05 duty ratio is therefore the remnant of the original antisymmetric line-shape, skewed by the lower magnitude of the effective repulsive potential.

This analysis of the impact of a on ratchet current reveals that (i) the asymmetry provided by decay of the applied potential in the z-direction in our experimental system with unbiased drive can substitute for the asymmetry provided by a biased drive in the 1D model system, and (ii) the thickness and dielectric constant of the transport layer is tunable to optimize directional transport for a specific duty ratio (e.g., 0.5, an unbiased drive).

Figure 23:
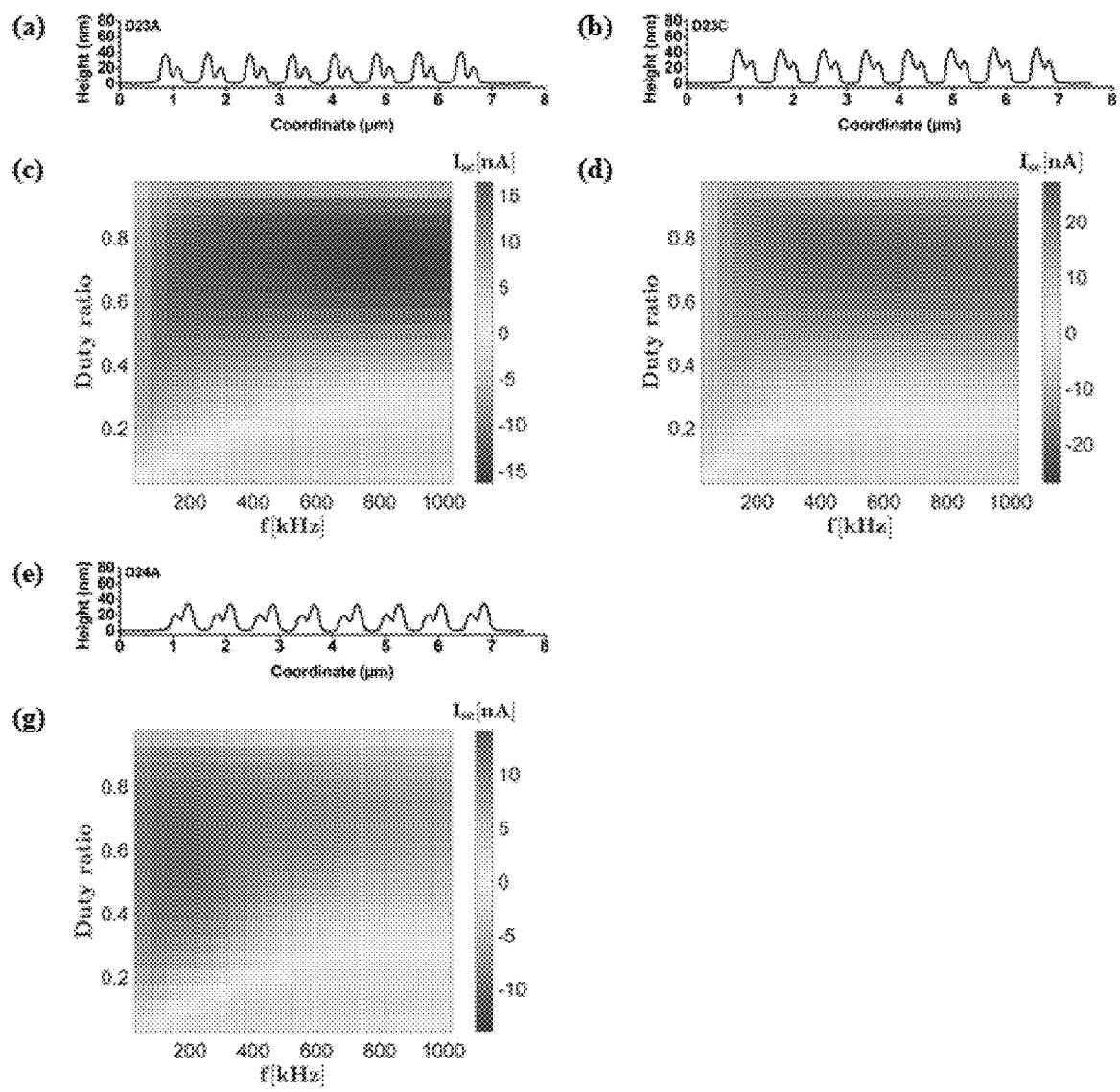
FIG. 23. Atomic force microscopy line scans of devices (Panel a) D23 A (Panel b) D23 C and (Panel e) D24 A. (Panels c,d,g) Measured current vs. frequency and duty ratio for devices (Panel c) D23 A, (Panel d) D23 C and (Panel g) D24 A, all with 50% P3HT, A=10 V.
Figure 24:
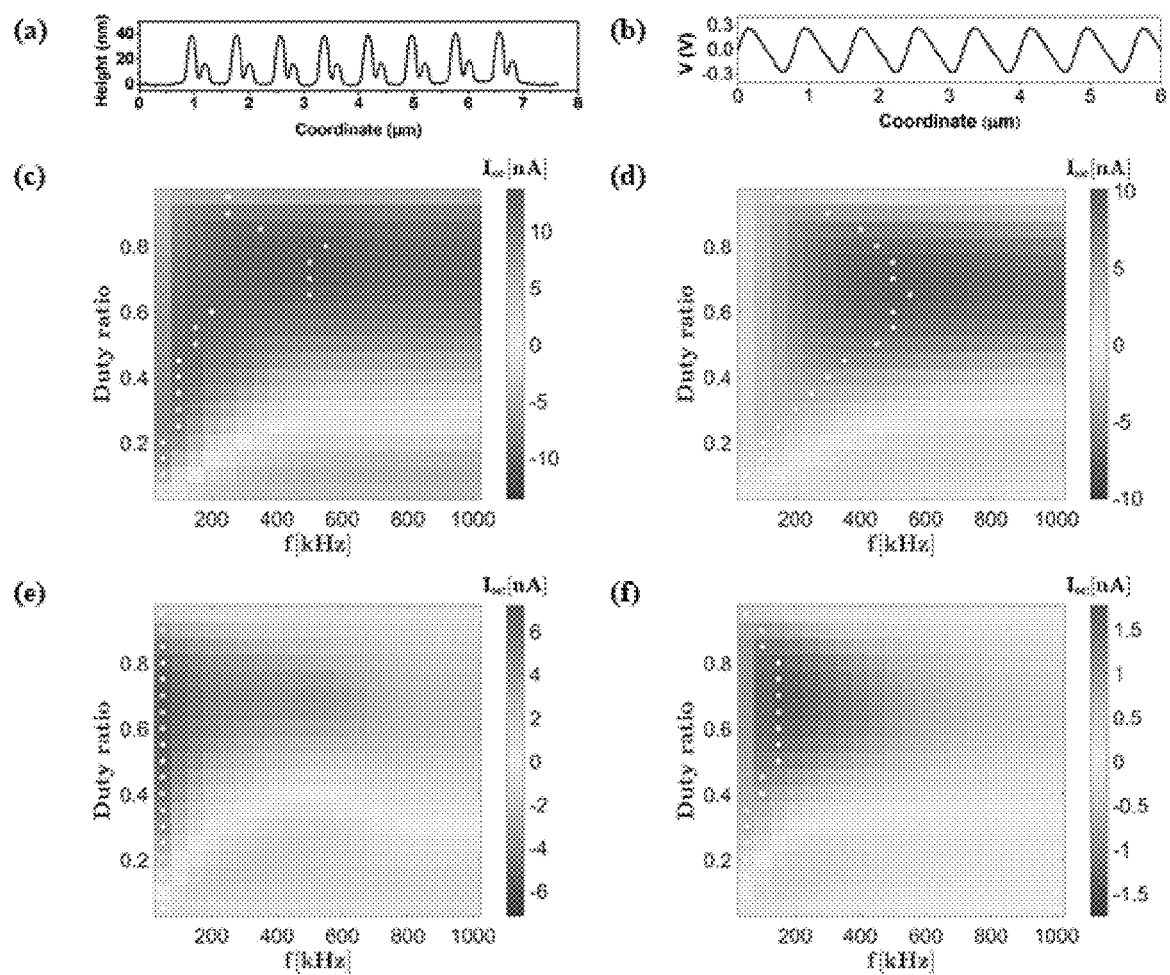
FIG. 24. Measurements and simulation for device D21 A. (Panel a) Atomic force microscopy line scan of the finger electrode array. (Panel b) Shape of a biharmonic potential (eq 3) for $\alpha_1$=0.25 V·q, $\alpha_2$=0.05 V·q, L=800 nm. (Panels c,e) Measured current vs. frequency and duty ratio for D21 A with a (Panel c) 50% P3HT film and (Panel e) 100% P3HT film. (Panels d,f) Current calculated using an analytical solution for a two-state potential model, as described in eq 3-5, with σ=500 μm·50 nm, L=800 nm, T=293 K, =0.25 V·q, $\alpha_2$=0.05 V·q, and $n_e$=10$^{15}$ cm$^{-3}$, where d) D is normally distributed with a mean at d) 2.5×10$^{-4}$ cm² s$^{-1}$ and a standard deviation of 2×10$^{-4}$ cm² s$^{-1}$; cm² s or f) 0.3×10$^{-4}$ cm² s$^{-1}$ and a standard deviation of 1×10$^{-4}$ cm² s$^{-1}$. In panels c-f, the frequency maximizing the current for each duty ratio is marked with a dot.

Operating frequency of the driving field and carrier mobility. Because $\alpha$ was estimated as ~$-0.5$ for the experimental system, the value of the carrier diffusion coefficient D for the transport layer was determinable, and quantitative agreement between the experiment and the model was achievable, and the optimal driving frequency for the ratchet was predicted. In FIG. 2c both the duty ratio and the oscillation frequency are varied for device D21 A, with a 50% P3HT film; a major peak of positive current, and a weaker peak of negative current was observed, with a transition between positive and negative currents at a duty ratio of ~0.3-0.4 for most frequencies (see FIGS. 23-25 for measurements and simulations of other devices). FIG. 21 Panel d shows the calculated current (with the 1D model) vs. duty ratio and frequency, with parameters programmed to simulate device D21 A, including the carrier density set to a reasonable value (Refs. B24, B25: herein incorporated by reference in their entireties) for undoped P3HT of $n_e=10^{15}$ cm$^{-3}$. To obtain maximum quantitative agreement between experiment and theory, D must be properly modeled, which both scales the current directly and controls its frequency response, via $$\xi \equiv \left(\frac{L}{2\pi}\right)^2/D\tau,$$

where $\tau=1/f$. The modeled current peaks for some value of $\xi$, denoted $\xi_{peak}$, and so for any fixed D and L, provides peak operating frequency $f_{peak}=1/\tau_{peak}$. It follows that by measuring the peak operating frequency in an experimental device, the corresponding value of D is determined for its transport layer using the relation $\xi$. This value of D, along with knowledge of α as described above, allows quantitative simulation plots like FIG. 21 Panel c and testing of the validity of the model by assessing the reasonableness of the derived value of D given the electrical properties of the transport layer.

Figure 25:
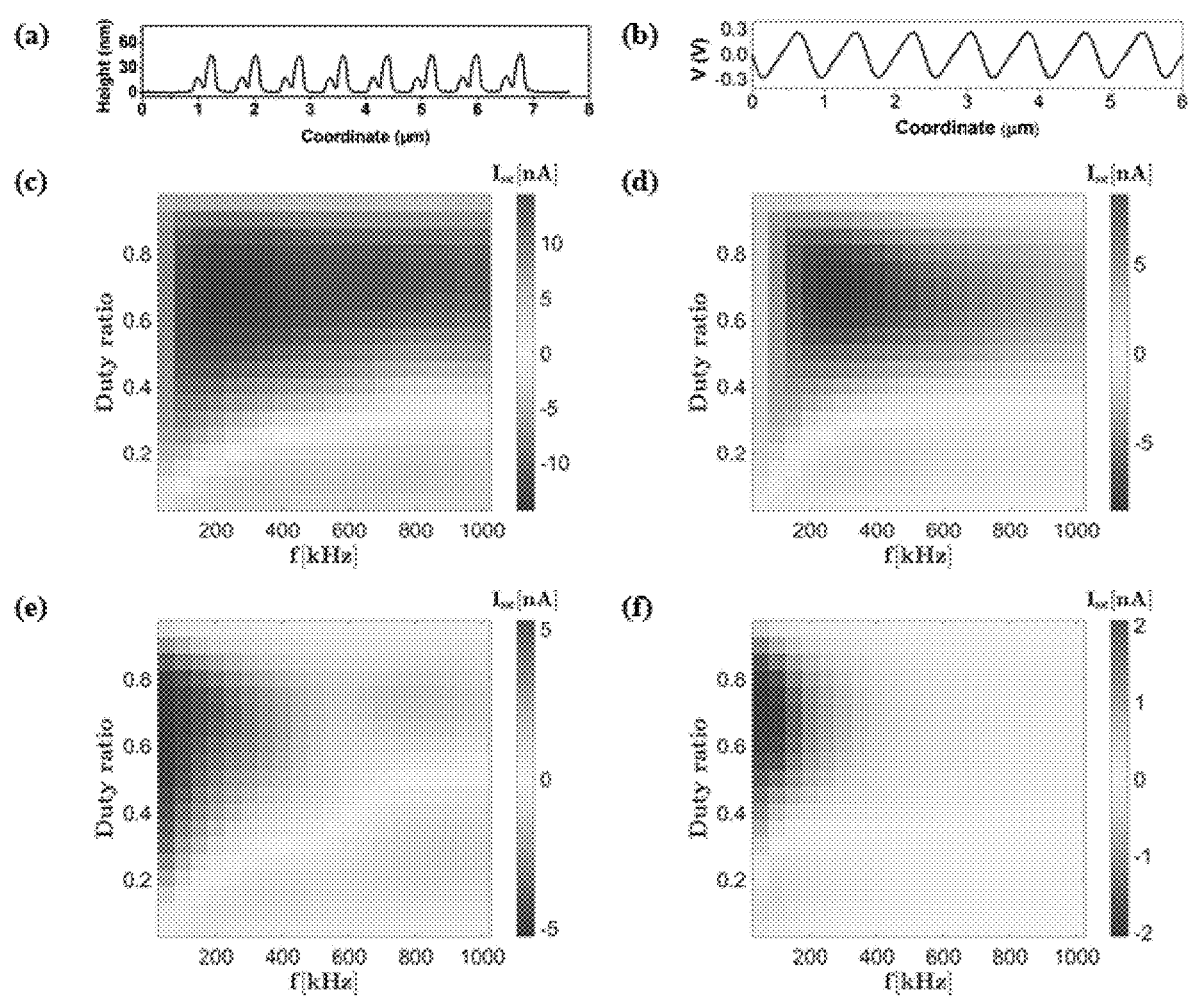
FIG. 25. Measurements and simulation for device D21 C. (Panel a) Atomic force microscopy line scan of the finger electrode array. (Panel b) Shape of a biharmonic potential (eq 3) for $\alpha_1$=−0.25 V·q, $\alpha_2$=−0.05 V·q, L=800 nm. (Panels c,e) Measured current vs. frequency and duty ratio for D21 C with a (Panel c) 50% P3HT film and (Panel e) 100% P3HT film. (Panels d,f) Current calculated using an analytical solution for a two-state potential model, as described in eq 3-5, with σ=500 μm·50 nm, L=800 nm, T=293 K, $\alpha_1$=−0.25 V·q, $\alpha_2$=−0.05 V·q, and $n_e$=10$^{15}$ cm$^{-3}$. Simulated current vs. frequency and duty ratio for c) D=2×10$^{-4}$ cm² s$^{-1}$ and f) D=5×10$^{-5}$ cm² s$^{-1}$.
Figure 26:
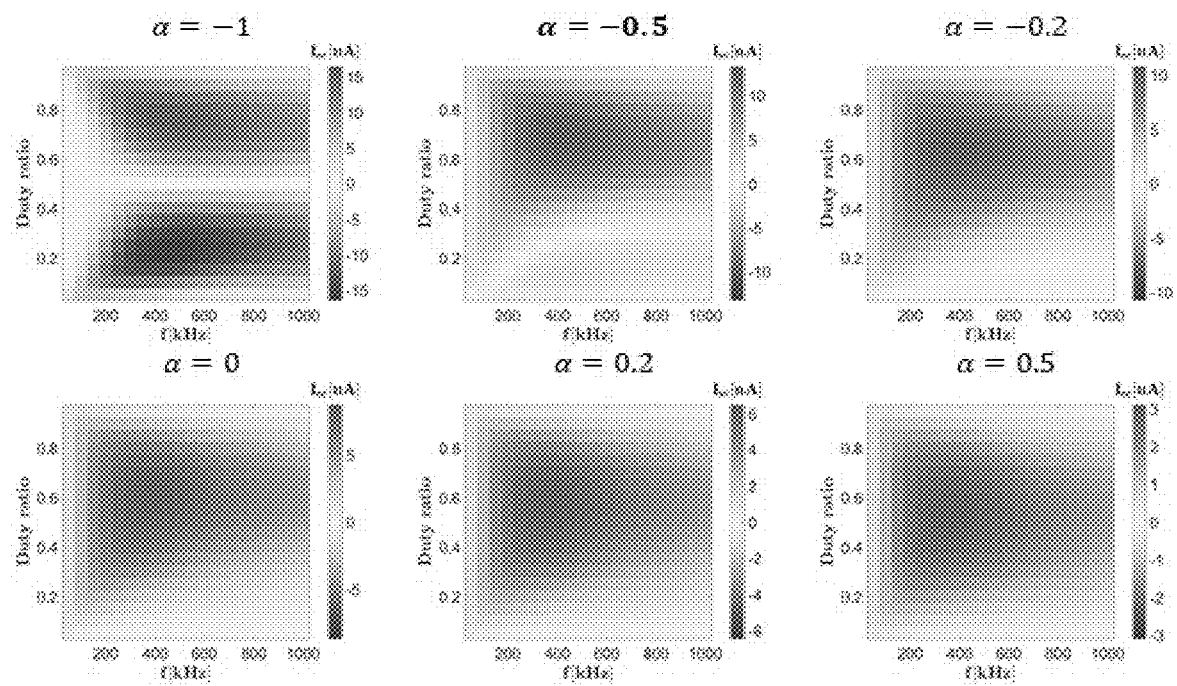
FIG. 26. Simulated current vs. frequency and duty ratio for different values of α (indicated).
Figure 27:
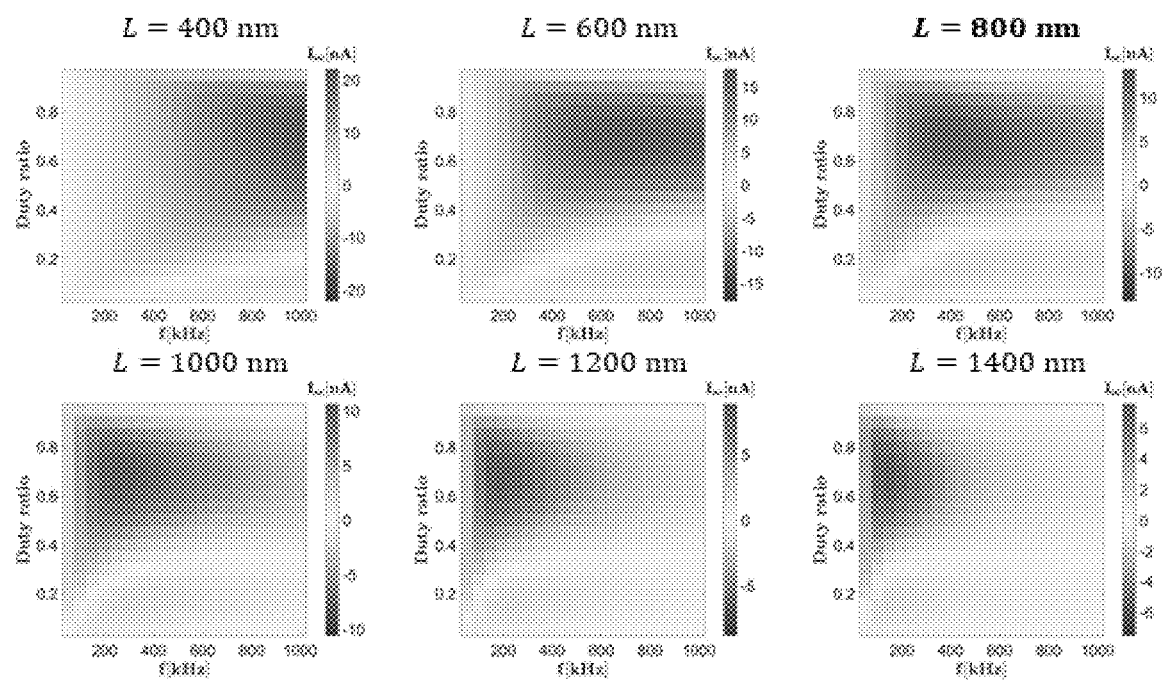
FIG. 27. Simulated current vs. frequency and duty ratio for different values of L (indicated).
Figure 28:
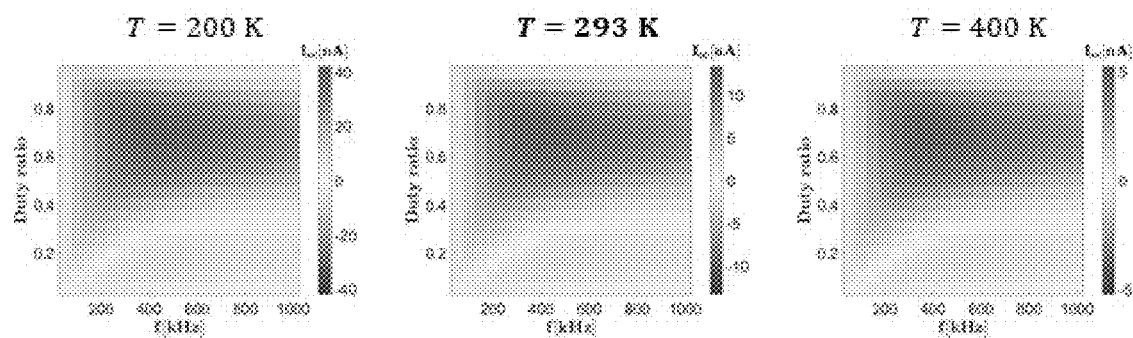
FIG. 28. Simulated current vs. frequency and duty ratio for different values of T (indicated).
Figure 29:
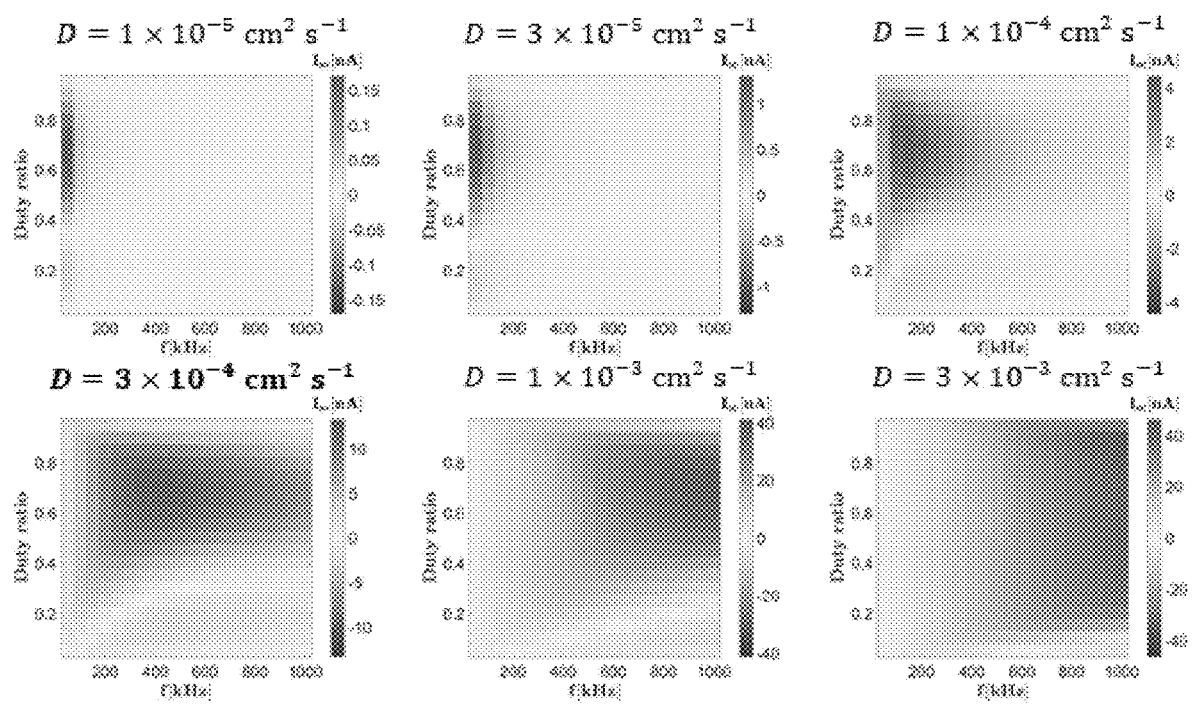
FIG. 29. Simulated current vs. frequency and duty ratio for different values of D (indicated).
Figure 30:
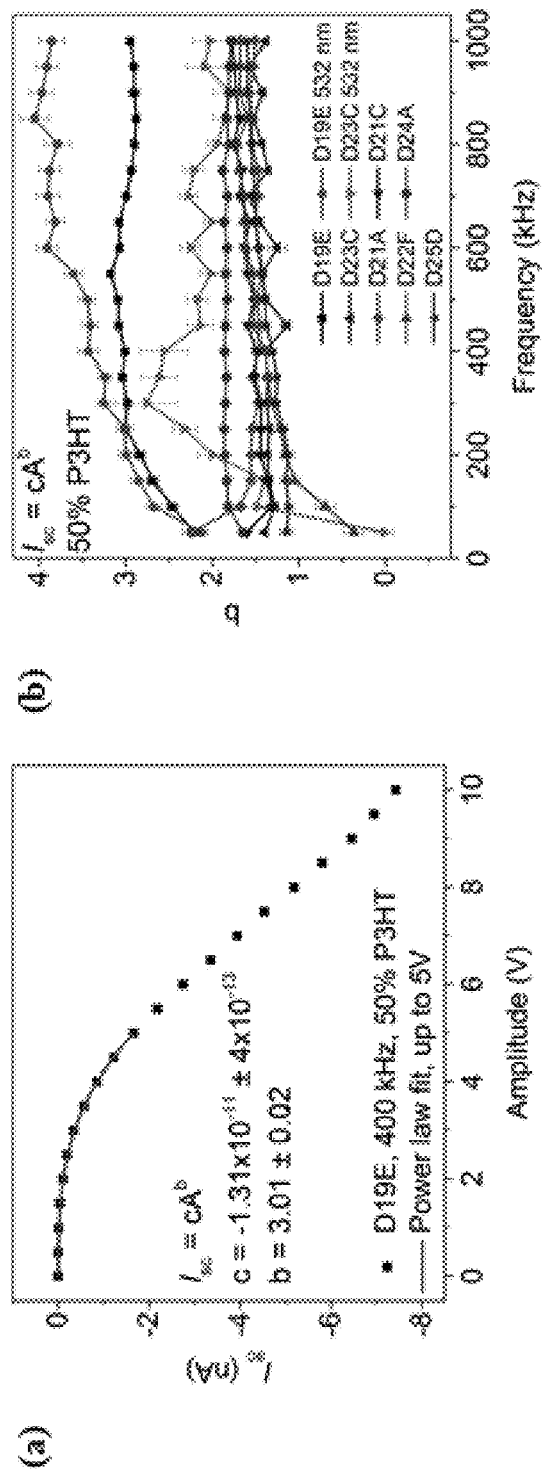
FIG. 30. (Panel a) Current as a function of amplitude for one device, D19 E, in the dark, for an oscillation frequency of 400 kHz. The results of the power law fit are shown, and the uncertainty is the standard error of the fit. (Panel b) The exponent values for power law fits to the current vs. amplitude plots (from 0 to 5 V) of a variety of devices (indicated), at different frequencies. The errors bars are standard errors of the fit, and in some cases are smaller than the symbols.

Based on this calculation for the dataset in FIG. 21 Panel c, the simulated dataset in FIG. 21 Panel d was obtained by setting D to be normally distributed with a mean at $2.5 \times 10^{-4}$ cm$^2$ s$^{-1}$ and a standard deviation of $2 \times 10^{-4}$ cm$^2$ s$^{-1}$. For 100% P3HT films, good agreement for D of mean $0.3 \times 10^{-4}$ cm$^2$ s$^{-1}$ was found ($\pm 1 \times 10^{-4}$ cm$^2$ s$^{-1}$, FIG. 24 Panel f). A distribution was used, rather than a single value of D because any single value of D produces an overly sharp peak of current vs. frequency (FIGS. 25, 29). This distribution was interpreted to be a result of a non-uniform diffusion coefficient in the experimental films (e.g., in the y-direction, along the width of the channel) due to the poor uniformity of the drop-cast films, such that the measurements are an average of multiple current paths, with a variety of D values. The need for this correction in D implies that earlier assumption of uniformity in the y-direction is not strictly correct.

Figure 22:
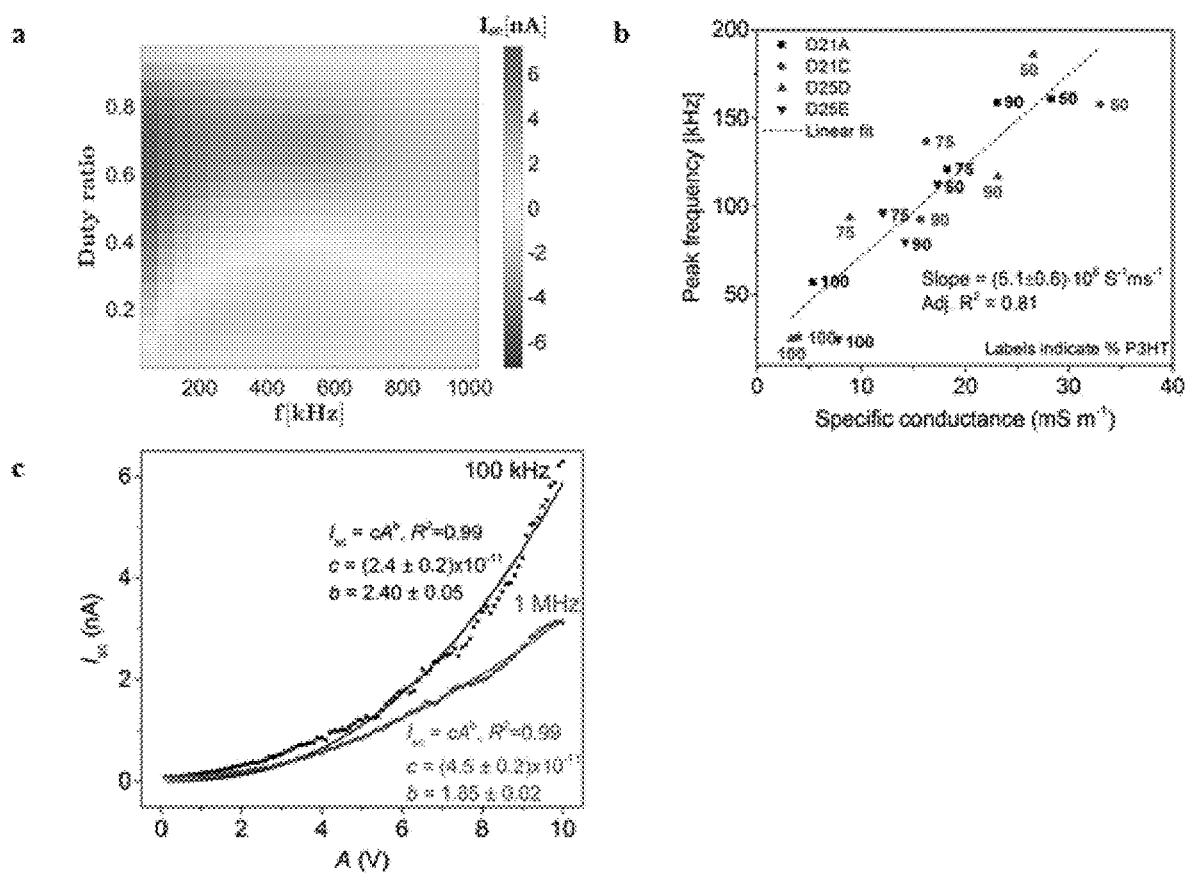
FIG. 22. The impact of conductivity and amplitude on experimental ratchet performance. (Panel a) $I_{sc}$ vs. duty ratio and flashing frequency for device D21 A with a 100% P3HT film. (Panel b) The frequency maximizing the ratchet current vs. the specific conductance for four ratchet devices, coated with four different film compositions (the labels indicate % P3HT, with PCBM making up the remainder), and a linear fit (dashed red); A=10 V in all cases. (Panel c) Measured $I_{sc}$ vs. A (for 0.5 duty ratio), for device D21 A coated with a 75% P3HT film, at two frequencies (indicated); symbols are data, lines are power law fits.

The 1D model was used to predict a dielectric response of the transport material (through the parameter α), which produces peak ratchet current with an unbiased drive. The 1D model was also used to predict $f_{peak}$ for a transport layer with a particular value of D, which is proportional to the mobility, and the conductivity (Ref B26; herein incorporated by reference in its entirety), of the film. Since $f_{peak}$ scales linearly with D (at any duty ratio), it scales linearly with the measured conductivities of the transport layers films, given a fixed periodicity L across all of the measured devices. Devices were fabricated with different DC conductivities, by varying the P3HT content of the film. FIG. 22 Panels a,b shows that, in agreement with the model's prediction, increasing the P3HT content reduces both the conductivity and $f_{peak}$, and the two are approximately linearly correlated. The ratchet is tunable to operate at a range of oscillation frequencies by modifying the conductivity of the transport layer. Applying the linear relationship shown in FIG. 22 Panel b to a wider range of conductivities indicates that, solely by tuning the mobility of the majority carriers, ratchets of this design operate with peak frequencies from kHz to hundreds of GHz for crystalline Si, and THz for particularly high-mobility materials, e.g., GaAs (Ref. B27; herein incorporated by reference in its entirety).

The major feature of the experimental data that is not reproduced by the 1D model is the dependence of $I_{sc}$ on the amplitude of the potential, A. An initial power-law dependence was observed ($I_{sc}=cA^b$, where c is a constant) for low amplitudes (A≤~5 V), followed by a linear dependence and for some frequencies, saturation at high amplitudes, forming a sigmoidal curve (Ref. B6; herein incorporated by reference in its entirety); in the model, $I_{sc}$ scales as $A^3$ (via the terms $a_1{}^2 a_2$). Fitting the experimental plots of $I_{sc}$ vs. A with a power law yields exponents ranging from 1 to 4, FIG. 22 Panel c and 30. The model properly approximates the experimental observations for relatively weak potentials, where carrier-carrier Coulombic repulsion (neglected in the model) is of lesser importance. Strong potentials work to localize the carriers in smaller volumes, and interparticle repulsion acts against localization. For the strongest applied potentials, no more particles can be localized in the wells due to mutual repulsion, and the current saturates—an effect which cannot be accounted for by the model. A decrease in ratchet current upon an increase of carrier density (using illumination) has been observed (Ref. B6; herein incorporated by reference in its entirety), an effect attributed to competitive effects due to interparticle repulsion (Refs. B28, B29; herein incorporated by reference in their entireties).

Experiments conducted during development of embodiments herein demonstrate that tuning both the physical parameters of an organic flashing electronic ratchet and the temporal waveform that drives it allows maximization of the ratchet current, minimization of the ratchet current, and/or reverse of current direction. A ratcheting mechanism is provided that utilizes carrier motion in the z-direction of the 3D transport layer, and the dielectric response of the layer, to enable the rectification of unbiased temporal waveforms, in contrast with previously published flashing ratchet systems. The relationship between conductivity and peak operating frequency allows tuning of the driving frequency of the ratchet across a wide range, by simply employing a material with the appropriate carrier mobility. The tunable frequency works hand-in-hand with the ability to utilize unbiased waveforms, to open the door to the use of sources such as electromagnetic radiation to power ratchets, by coupling a ratchet to an appropriately tuned antenna.

REFERENCES

The following references, some of which are cited above by number are herein incorporated by reference in their entireties.

1. R. D. Astumian, Design principles for Brownian molecular machines: how to swim in molasses and walk in a hurricane. Phys. Chem. Chem. Phys. 9, 5067-5083 (2007).
2. J. C. M. Gebhardt, A. E. M. Clemen, J. Jaud, M. Rief, Myosin-V is a mechanical ratchet. Proc. Natl. Acad. Sci. U.S.A. 103, 8680-8685 (2006).
3. N. J. Carter, R. A. Cross, Mechanics of the kinesin step. Nature 435, 308-312 (2005).
4. D. Stock, A. G. W. Leslie, J. E. Walker, Molecular Architecture of the Rotary Motor in ATP Synthase. Science 286, 1700-1705 (1999).
5. W. R. Browne, B. L. Feringa, Making molecular machines work. Nat. Nanotechnol. 1, 25-35 (2006).
6. P. Reimann, Brownian motors: noisy transport far from equilibrium. Phys. Rep. 361, 57-265 (2002).
7. S. F. Wulf et al., Force-producing ADP state of myosin bound to actin. Proc. Natl. Acad. Sci. U.S.A. 113, E1844-E1852 (2016).
8. S. Erbas-Cakmak, D. A. Leigh, C. T. McTernan, A. L. Nussbaumer, Artificial Molecular Machines. Chem. Rev. 115, 10081-10206 (2015).
9. J. Rousselet, L. Salome, A. Ajdari, J. Prost, Directional motion of brownian particles induced by a periodic asymmetric potential. Nature 370, 446-448 (1994).
10. T. Salger et al., Directed Transport of Atoms in a Hamiltonian Quantum Ratchet. Science 326, 1241-1243 (2009).
11. M. V. Costache, S. O. Valenzuela, Experimental spin ratchet. Science 330, 1645-1648 (2010).
12. H. Linke et al., Experimental Tunneling Ratchets. Science 286, 2314-2317 (1999).
13. E. M. Roeling et al., Organic electronic ratchets doing work. Nat. Mater. 10, 51-55 2011).

14. O. V. Mikhnenko, S. D. Collins, T.-Q. Nguyen, Rectifying Electrical Noise with an Ionic-Organic Ratchet. Adv. Mater. 27, 2007-2012 (2015).
15. T. Tanaka, Y. Nakano, S. Kasai, GaAs-Based Nanowire Devices with Multiple Asymmetric Gates for Electrical Brownian Ratchets. Jpn. J. Appl. Phys. 52, 06GE07-06GE07 (2013).
16. N. E. Jackson, B. M. Savoie, T. J. Marks, L. X. Chen, M. A. Ratner, The Next Breakthrough for Organic Photovoltaics? J. Phys. Chem. Lett. 6, 77-84 (2015).
17. D. Chaudhuri, A. Raju, A. Dhar, Pumping single-file colloids: Absence of current reversal. Phys. Rev. E 91, 050103-050103 (2015).
18. I. Derényi, T. Vicsek, Cooperative Transport of Brownian Particles. Phys. Rev. Lett. 75, 374-377 (1995).
19. D. Chakraborty, D. Chaudhuri, Stochastic ratcheting of two-dimensional colloids: Directed current and dynamical transitions. Phys. Rev. E 91, 050301-050301 (2015).
20. C. C. de Souza Silva, J. Van de Vondel, M. Morelle, V. V. Moshchalkov, Controlled multiple reversals of a ratchet effect. Nature 440, 651-654 (2006).
21. M. Yasin et al., P3HT:PCBM blend based photo organic field effect transistor. Microelectron. Eng. 130, 13-17 (2014).
22. P. Hanggi, F. Marchesoni, Artificial Brownian motors: Controlling transport on the nanoscale. Rev. Mod. Phys. 81, 387-442 (2009).
23. B. Lau, O. Kedem, M. A. Ratner, E. A. Weiss, Identification of Two Mechanisms for Current Production in a Biharmonic Flashing Ratchet. Phys. Rev. E 93, 062128-062128 (2016).
24. C. J. Kaiser, The Capacitor Handbook. (Springer Science & Business Media, 2012), pp. 118.
25. M. Kabir, D. Unluer, L. Li, A. W. Ghosh, M. R. Stan, Computing With Nonequilibrium Ratchets. IEEE Trans. Nanotechnol. 12, 330-339 (2013).
26. Z. L. Wang, W. Wu, Nanotechnology-enabled energy harvesting for self-powered micro-/nanosystems. Angew. Chem., Int. Ed. Engl. 51, 11700-11721 (2012).
27. K. Nakayama, K. Tanabe, H. A. Atwater, Plasmonic nanoparticle enhanced light absorption in GaAs solar cells. Appl. Phys. Lett. 93, 121904-121904 (2008).
B1. Hoffmann, P. M. Rep. Prog. Phys. 2016, 79, 032601.
B2. Astumian, R. D. Phys. Chem. Chem. Phys. 2007, 9, 5067-5083.
B3. Wulf, S. F.; Ropars, V.; Fujita-Becker, S.; Oster, M.; Hofhaus, G.; Trabuco, L. G.; Pylypenko, O.; Sweeney, H. L.; Houdusse, A. M.; Schroder, R. R. Proc. Natl. Acad. Sci. U.S.A. 2016, 113, E1844-E1852.
B4. Coropceanu, V.; Sanchez-Carrera, R. S.; Paramonov, P.; Day, G. M.; Brédas, J.-L. J. Phys. Chem. C 2009, 113, 4679-4686.
B5. Laquai, F.; Andrienko, D.; Mauer, R.; Blom, P. W. M. Macromol. Rapid Commun. 2015, 1001-1025.
B6. Kedem, O.; Lau, B.; Ratner, M. A.; Weiss, E. A. Proc. Natl. Acad. Sci. U.S.A. 2017, Early Edition.
B7. Roeling, E. M.; Germs, W. C.; Smalbrugge, B.; Geluk, E. J.; de Vries, T.; Janssen, R. A. J.; Kemerink, M. Nat. Mater. 2011, 10, 51-55.
B8. Hanggi, P.; Marchesoni, F. Rev. Mod. Phys. 2009, 81, 387-442.
B9. Reimann, P. Phys. Rep. 2002, 361, 57-265.
B10. Lau, B.; Kedem, O.; Schwabacher, J.; Kwasnieski, D.; Weiss, E. A. Mater. Horiz. 2017, 4, 310-318.
B11. Bader, J. S.; Deem, M. W.; Hammond, R. W.; Henck, S. A.; Simpson, J. W.; Rothberg, J. M. Appl. Phys. A 2002, 75, 275-278.
B12. Bader, J. S.; Hammond, R. W.; Henck, S. A.; Deem, M. W.; McDermott, G. A.; Bustillo, J. M.; Simpson, J. W.; Mulhern, G. T.; Rothberg, J. M. Proc. Natl. Acad. Sci. U.S.A. 1999, 96, 13165-13169.
B13. Germs, W. C.; Roeling, E. M.; van Ijzendoorn, L. J.; Smalbrugge, B.; de Vries, T.; Geluk, E. J.; Janssen, R. A. J.; Kemerink, M. Phys. Rev. E 2012, 86, 041106.
B14. Müller, T.; Würtz, A.; Lorke, A.; Reuter, D.; Wieck, A. D. Appl. Phys. Lett. 2005, 87, 042104.
B15. Tanaka, T.; Nakano, Y.; Kasai, S. Jpn. J. Appl. Phys. 2013, 52, 06GE07.
B16. Lau, B.; Kedem, O.; Ratner, M. A.; Weiss, E. A. Phys. Rev. E 2016, 93, 062128.
B17. Wu, S.-H.; Huang, N.; Jaquay, E.; Povinelli, M. L. Nano Lett. 2016, 16, 5261-5266.
B18. Germs, W. C.; Roeling, E. M.; van Ijzendoorn, L. J.; Janssen, R. A. J.; Kemerink, M. Appl. Phys. Lett. 2013, 102, 073104.
B19. Tarlie, M. B.; Astumian, R. D. Proc. Natl. Acad. Sci. U.S.A. 1998, 95, 2039-2043.
B20. Chauwin, J. F.; Ajdari, A.; Prost, J. Europhys. Lett. 1995, 32, 373-378.
B21. Rozenbaum, V. M. JETP Letters 2009, 88, 342-346.
B22. Kedem, O.; Lau, B.; Weiss, E. A. ACS Nano 2017, 11, 7148-7155.
B23. Rozenbaum, V. M. Personal communication 2017.
B24. Bisquert, J.; Garcia-Belmonte, G.; Munar, A.; Sessolo, M.; Soriano, A.; Bolink, H. J. Chem. Phys. Lett. 2008, 465, 57-62.
B25. Foertig, A.; Baumann, A.; Rauh, D.; Dyakonov, V.; Deibel, C. Appl. Phys. Lett. 2009, 95, 052104-052104.
B26. Bisquert, J. Phys. Chem. Chem. Phys. 2008, 10, 3175-3194.
B27. Sze, S. M.; Ng, K. K., Physics of semiconductor devices. Wiley-Interscience: Hoboken, N.J., 2007; p 815.
B28. Chakraborty, D.; Chaudhuri, D. Phys. Rev. E 2015, 91, 050301.
B29. Chaudhuri, D.; Raju, A.; Dhar, A. Phys. Rev. E 2015, 91, 050103.

The invention claimed is:
1. A device comprising:
(a) a particle transport layer,
(b) a dielectric layer, and
(c) a repeating asymmetric electrode layer comprising multiple regularly spaced electrodes;
wherein the dielectric layer physically separates the particle transport layer and the repeating asymmetric electrode layer;
wherein application of an electric potential to the electrodes induces repeating asymmetric electric field within the particle transport layer; and
wherein time-oscillation of the electric potential results in asymmetric-electric-field-induced mono-directional particle transport through the particle transport layer without the requirement of an overall source-drain bias in the direction of transport.
2. The device of claim 1, wherein the particle transport layer comprises a bulk heterojunction (BJH) film.
3. The device of claim 1, wherein the BJH film comprises a blend of poly(3-hexyl-thiophene-2,5-diyl)(P3HT) and [6,6]-phenyl-$C_{61}$ butyric acid methyl ester (PCBM).
4. The device of claim 3, wherein the BJH film comprises a 1:1 P3HT:PCBM blend.
5. The device of claim 1, wherein the particle transport layer produces mobile electrons and holes upon dissociation of photoexcited states.

6. The device of claim 1, wherein there is no overall source-drain bias across the particle transport layer.

7. The device of claim 1, wherein there is an overall source-drain bias across the particle transport layer in the opposing direction of mono-directional particle transport.

8. The device of claim 1, wherein the repeating asymmetric electrode layer comprises an array of four or more linearly-arranged, regularly-spaced finger electrodes with an asymmetric thickness profile along the direction of transport.

9. The device of claim 8, wherein the finger electrodes sit upon a thermal silicon oxide layer.

10. The device of claim 8, wherein the finger electrodes are 20 nm to 1 µm in width.

11. The device of claim 10, wherein the finger electrodes are separated by 20 nm to 1 µm.

12. The device of claim 8, wherein the electric potential applied to the electrodes is between 10 kHz and 10 MHz.

13. The device of claim 1, wherein the transported particles are electrons.

14. The device of claim 13, wherein the electrons are thermally- or photo-generated in the particle transport layer.

15. The device of claim 13, wherein the transport of electrons through the particle transport layer creates direct electric current across the particle transport layer.

16. The device of claim 15, wherein the particle transport layer is photo-responsive and illumination alters the direct electric current.

17. A method of mono-directionally transporting particles through a transport material, without an overall source-drain bias in the direction of transport, comprising applying time-oscillated electric potential to multiple regularly spaced electrodes within a repeating asymmetric electrode layer that is physically separated from the transport material by a dielectric material, thereby inducing a repeating asymmetric electric field within the transport material, wherein the asymmetric electric field drives mono-directional particle transport through the transport layer without the requirement of an overall source-drain bias in the direction of transport.

* * * * *